United States Patent
Park

(10) Patent No.: US 7,164,230 B2
(45) Date of Patent: Jan. 16, 2007

(54) DUAL PANEL-TYPE ORGANIC ELECTROLUMINESCENT DISPLAY DEVICE AND METHOD FOR FABRICATING THE SAME

(75) Inventor: Jae-Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 166 days.

(21) Appl. No.: 11/020,086

(22) Filed: Dec. 23, 2004

(65) Prior Publication Data

US 2005/0140308 A1  Jun. 30, 2005

(30) Foreign Application Priority Data

Dec. 26, 2003  (KR) .................... 10-2003-0097938

(51) Int. Cl.
*H01J 1/62* (2006.01)
*G09G 37/00* (2006.01)

(52) U.S. Cl. .................................. 313/505; 315/169.3

(58) Field of Classification Search ............ 315/169.3; 313/503, 505, 506, 509, 600, 601, 603, 606, 313/608; 345/82, 83, 92

See application file for complete search history.

(56) References Cited

U.S. PATENT DOCUMENTS

| | | | |
|---|---|---|---|
| 6,175,345 B1 | 1/2001 | Kuribayashi et al. | 345/7.6 |
| 6,548,961 B1 | 4/2003 | Barth et al. | 315/169.3 |
| 6,927,536 B1 * | 8/2005 | Kim et al. | 313/504 |
| 6,936,846 B1 * | 8/2005 | Koyama et al. | 257/71 |
| 6,940,476 B1 * | 9/2005 | Ko | 345/76 |
| 2002/0158577 A1 | 10/2002 | Shimoda et al. | 313/506 |

FOREIGN PATENT DOCUMENTS

| | | |
|---|---|---|
| JP | 2000-231118 | 8/2000 |
| JP | 2001-177509 | 4/2001 |
| KR | 2002-0047889 | 6/2002 |
| KR | 2003-0086166 | 11/2003 |
| KR | 2004-0079476 | 9/2004 |
| WO | WO-02/078101 | 10/2005 |

* cited by examiner

*Primary Examiner*—Shih-Chao Chen
*Assistant Examiner*—Minh Dieu A
(74) *Attorney, Agent, or Firm*—Morgan, Lewis & Bockius LLP

(57) ABSTRACT

A dual panel-type organic electroluminescent device includes first and second substrates spaced apart from each other, a gate line, a data line, and a power line formed over the first substrate, a switching thin film transistor connected to the gate and data lines, a driving thin film transistor connected to the power line and the switching thin film transistor, the driving thin film transistor including a driving semiconductor layer, a driving source, a driving drain, a first driving gate underneath the driving semiconductor layer, and a second driving gate above the driving semiconductor, an electrical connector over the first substrate, the electrical connector including a connection electrode layer connected to the driving thin film transistor, first and second thin film transistor connectors connecting the switching thin film transistor to the driving thin film transistor, and an organic electroluminescent diode on the second substrate, the organic electroluminescent diode connected to the electrical connector.

36 Claims, 31 Drawing Sheets

DUAL PANEL-TYPE ORGANIC ELECTROLUMINESCENT DISPLAY DEVICE AND METHOD FOR FABRICATING THE SAME

The present invention claims the benefit of Korean Patent Application No. 2003-0097938 filed in Korea on December 26, which is hereby incorporated by reference.

BACKGROUND OF THE INVENTION

1. Field of the Invention

The present invention relates to a display device and a method of fabricating a display device, and more particularly, to an active matrix electroluminescent display device and a method of fabricating an active matrix electroluminescent display device.

2. Discussion of the Related Art

As the need for displaying information increases, requirements for flat panel displays having thin profiles, light-weight, and lower power consumption also increases. Accordingly, various flat panel display (FPD) devices, such as liquid crystal display (LCD) devices, plasma display panel (PDP) devices, field emission display (FED) devices, and electro-luminescence display (ELD) devices, have been developed.

The ELD devices make use of an electro-luminescence phenomenon in which light is generated when an electrical signal is supplied to a fluorescent substance. The ELD devices can be classified into inorganic electroluminescent display (IELD) devices and organic electroluminescent display (OELD) devices, depending upon a source used to excite carriers. The OELD devices have been increasingly used due to their ability to display a wide range of visible wavelengths of light, and because of their high brightness and low voltage requirements.

Since the OELD devices are a self-luminescent, they have high contrast ratios and are suitable for ultra-thin type display devices. In addition, since they have simple manufacturing processes, the degree of environmental contamination is relatively low. Furthermore, the OELD devices have response times of only a few microseconds (µs), thereby making the OELD devices suitable for displaying moving images, and they have non-limiting viewing angles and are stable at low operating temperatures. In addition, since the OELD devices are driven with a relatively low voltage between 5V and 15V, manufacturing and design of their driving circuits are easy.

Although structures of the OELD devices are similar to that of the IELD devices, the light-emitting theory of the OELD devices is different from that of the IELD devices. For example, the OELD devices emit light by recombination of electrons and holes, and thus they are commonly referred to as organic light emitting diode devices. Recently, active matrix types of ELD devices having a plurality of pixels arranged in a matrix configuration and thin film transistors connected thereto have been commonly applied to the flat panel display devices. The active matrix type has also been applied to the OELD devices, and this is commonly referred to as an active matrix OELD device.

FIG. 1 is a cross sectional view of an OELD device according to the related art. In FIG. 1, first and second substrates 10 and 60 that are spaced apart from each other and have inner surfaces facing each other have a plurality of sub-pixel regions. Then, an array layer AL, which includes thin film transistors (TFTs) T within each of the pixel regions P, is formed along an inner surface of the first substrate 10, and a first electrode 48 connected to the TFT T is formed on the array layer AL within each of the pixel regions P. Next, red, green, and blue organic electroluminescent (EL) layers 54 are alternately formed on the first electrode 48, and a second electrode 56 is formed on the organic EL layers 54. Accordingly, the first and second electrodes 48 and 58 and the organic EL layer 54 interposed therebetween constitute an organic EL diode E. The organic EL device shown in FIG. 1 is a bottom-type OELD where light is emitted from the organic EL layer 54 through the first electrode 48 and out of the first substrate 10.

In FIG. 1, the second substrate 70 is used as an encapsulation substrate and includes a concave portion 62 at an inner center portion of the second substrate 70, wherein the concave portion 62 is filled with a moisture absorbent material, such as a desiccant 64, that removes moisture and oxygen to protect the organic EL diode E. In addition, the inner surface of the second substrate 70 is spaced apart from the second electrode 56, wherein the first and second substrates 10 and 70 are attached with a sealant 70 along a peripheral portion of the first and second substrates 10 and 70 for encapsulation.

FIG. 2A is a plan view of a basic pixel structure of an active matrix OELD device according the related art. In FIG. 2A, a gate line 22 is disposed along a first direction, and a power line 28 and a data line 42 are disposed along a second direction perpendicularly crossing the gate line 22, whereby the power line 28 and the data line 42 define a pixel region P by the crossing of the gate line 22. A switching thin film transistor $T_S$ is disposed near a crossing of the gate and data lines 22 and 42, and a driving thin film transistor $T_D$ is located adjacent to the switching thin film transistor $T_S$ within the pixel region P. In addition, a first electrode 48 of a light emitting diode is connected to the driving thin film transistor $T_D$ in the pixel region P.

A storage capacitor $C_{ST}$ is disposed over the power line 28 and includes a capacitor electrode 16 that functions as a first storage electrode and a portion of the power line 28 that functions as a second storage electrode. Although not shown, an organic electroluminescent layer and a second electrode are sequentially disposed on the first electrode 48 to form a light emitting diode (LED) E. Thus, the area where the first electrode 48 is disposed can be commonly referred to as an organic electroluminescent area.

In FIG. 2A, the switching thin film transistor (TFT) $T_S$ includes a switching gate electrode 23 that extends from the gate line 22, and a switching semiconductor layer 31 that is integrally formed with the capacitor electrode 16. The switching TFT $T_S$ also includes a switching source electrode 35a that extends from the data line 42, and a switching drain electrode 35b that is spaced apart from the switching source electrode 35a across the switching gate electrode 23. The switching source and drain electrodes 35a and 35b contact the switching semiconductor layer 31 through contact holes.

The driving thin film transistor (TFT) $T_D$ includes a driving gate electrode 20 and a driving semiconductor layer 14, wherein the driving semiconductor layer 14 is simultaneously formed with the capacitor electrode 16 and the switching semiconductor layer 31, but is spaced apart from each of the capacitor electrode 16 and the switching semiconductor layer 31. The driving gate electrode 20 is in contact with the switching drain electrode 35b through a contact hole. Additionally, the driving TFT TD includes a driving source electrode 38 and a driving drain electrode 40 that are both formed having an island pattern shape over the driving semiconductor layer 14. The driving drain electrode 40 and the driving source electrode 38 contact the driving semiconductor layer 14 through a first contact hole 32 and through a second contact hole 34, respectively.

In FIG. 2A, a power electrode 26 that extends from the power line 28 is overlapped by a portion of the driving source electrode 38 such that driving source electrode 38 contacts the power electrode 26 through a third contact hole 36. The first electrode 48 of the LED E overlaps the driving drain electrode 40 and contacts the driving drain electrode 40 through a fourth electrode 46 that may corresponds to the first contact hole 32.

FIG. 2B is a cross sectional view along IIb—IIb of FIG. 2A showing a driving thin film transistor, a storage capacitor, and a light emitting diode according to the related art. In FIG. 2B, a buffer layer 12 is formed along an entire surface of a substrate 10. A driving thin film transistor $T_D$ and a storage capacitor $C_{ST}$ are disposed on the buffer layer 12, and a light emitting diode (LED) E is formed over the substrate 10.

Specifically, a driving semiconductor layer 14 and a capacitor electrode 16 are formed on the buffer layer 12. The driving semiconductor layer 14 includes an active area 14a within a middle portion of the driving semiconductor layer 14, and source and drain areas 14b and 14c along opposing sides of the active area 14a. The driving semiconductor layer 14 and the capacitor electrode 16 are spaced apart from each other, but are simultaneously formed of the same material. Then, a gate insulating layer 18 and a driving gate electrode 20 are sequentially formed ion the active area 14a of the driving semiconductor layer 14, such the source and drain areas 14b and 14c are not covered by the gate insulating layer 18 and driving gate electrode 20.

Next, a first passivation layer 24 is formed on the buffer layer 12 to cover the driving semiconductor layer 14, the capacitor electrode 16, the gate insulating layer 18, and the driving gate electrode 20. Then, a power line 28 and a power electrode 26 are formed on the first passivation layer 24, wherein the power line 28 overlaps the capacitor electrode 16 such that the capacitor electrode 16 and the power line 28 constitute a storage capacitor $C_{ST}$. Next, a second passivation layer 30 is formed on the first passivation layer 24 to cover the power electrode 26 and the power line 28. The first and second passivation layers 24 and 30 have first and contact holes 32 and 34 that expose the drain area 14c and the source area 14b of the driving semiconductor layer 14, respectively. The second passivation layer 30 has also a third contact hole 36 that exposes a portion of the power electrode 26.

Then, driving source and drain electrodes 38 and 40 are formed on the second passivation layer 30. The driving drain electrode 40 contacts the drain area 14c through the first contact hole 32, and the driving source electrode 38 contacts the source area 14b and the power electrode 26 through the second contact hole 34 and through the third contact hole 36, respectively.

Next, a third passivation layer 44, which has a fourth contact hole 46 exposing the driving drain 40, is formed on the second passivation layer 30 to cover the driving source and drain electrodes 38 and 40. The driving semiconductor layer 14, the driving gate electrode 20, and the driving source and drain electrodes 38 and 40 constitute the driving thin film transistor $T_D$.

Then, a first electrode 48 of a transparent conductive material is formed on the third passivation layer 44, and contacts the driving drain 40 through the fourth contact hole 46. Next, an interlayer insulator 50 is formed on the third passivation layer 44 to cover the first electrode 48, and includes an opening that exposes a portion of the first electrode 48. Next, an organic electroluminescent (EL) layer 54 is formed to contact the first electrode 48 through the opening formed in the interlayer insulator 50, and a second electrode 56 of an opaque conductive material is formed on the interlayer insulator 50 and on the organic EL layer 54. Accordingly, the first electrode 48 functions as an anode and the second electrode 56 function as a cathode, wherein the first and second electrodes 48 and 56 and the organic EL layer 54 constitute the light emitting diode (LED) E.

In OELD devices according to the devices shown in FIGS. 1, 2A, and 2B, a TFT array part AL (in FIG. 1) and an organic light emitting (LED) diode E (in FIGS. 2A and 2B) are formed over the same substrate, such as the first substrate 10, and an additional second substrate, such as the second substrate 70, is attached to the first substrate for encapsulation. However, when the TFT array part and the organic LED diode are formed on one substrate in this way, production yield of the OELD device is determined by a product of the TFT's yield and the organic LED diode's yield. Since the organic LED diode's yield is relatively low, the production yield of the overall OELD device is limited by the organic LED diode's yield. For example, even when a TFT is properly fabricated, the OELD device using a thin film of about 1000 angstroms (Å) thickness can be determined to be inferior due to the defects of an organic electroluminescent layer. Thus, resulting in loss of materials and increased production costs.

In general, the OELD devices are classified into bottom emission-types and top emission-types according to an emission direction of light used for displaying images. Bottom emission-type OELD devices have the advantage of high encapsulation stability and high process flexibility. However, the bottom emission-type OELD devices are ineffective as high resolution devices since the disposition of the thin film transistors and the storage capacitor formed on the substrate results in poor aperture ratios. In contrast to bottom emission-type OELD devices, top emission-type OELD devices have a higher expected life span due to their simpler circuit layouts that yield high aperture ratios. However, in top emission-type OLED devices, the cathode is generally formed on an organic electroluminescent layer. As a result, transmittance and optical efficiency of a top emission-type OELD device are reduced because of a limited number of materials that may be selected as the cathode. If a thin film-type passivation layer is formed on the cathode to prevent the reduction of the light transmittance, then the thin film-type passivation layer can still fail in preventing the infiltration of exterior air into the organic electroluminescent layer.

Additionally, since the active matrix OELD devices of the related art include the thin film transistors and the storage capacitors within the light-emitting direction, they have decreased luminance areas and reduced aperture ratios. In order to overcome these problems, current density is increased to provide an increase in luminance of the device, thereby causing a decreased life span of the OELD device.

SUMMARY OF THE INVENTION

Accordingly, the present invention is directed to an OELD device and a method of fabricating an OELD device that substantially obviates one or more of the problems due to limitations and disadvantages of the related art.

An object of the present invention is to provide an OELD device having an improved production yield and reduced productions costs.

Another object of the present invention is to provide an OELD device having high resolution, high aperture ratios, and increased life span.

Another object of the present invention is to provide a dual panel-type OELD device having a TFT array and an organic light emitting diode disposed on first and second substrates, respectively.

Another object of the present invention is to provide a dual panel-type OELD device having a double gate structure driving TFT.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a dual panel-type organic electroluminescent device includes first and second substrates spaced apart from each other, a gate line, a data line, and a power line formed over the first substrate, a switching thin film transistor connected to the gate and data lines, a driving thin film transistor connected to the power line and the switching thin film transistor, the driving thin film transistor including a driving semiconductor layer, a driving source, a driving drain, a first driving gate underneath the driving semiconductor layer, and a second driving gate above the driving semiconductor, an electrical connector over the first substrate, the electrical connector including a connection electrode layer connected to the driving thin film transistor, first and second thin film transistor connectors connecting the switching thin film transistor to the driving thin film transistor, and an organic electroluminescent diode on the second substrate, the organic electroluminescent diode connected to the electrical connector.

In another aspect, a method of fabricating a dual panel-type organic electroluminescent device includes forming a gate line, a switching gate, a first driving gate, and a first thin film transistor connector on a first substrate, forming a first insulating layer on the first substrate to cover the gate line, the switching gate, the first driving gate, and the first thin film transistor connector, forming a switching semiconductor layer corresponding to the switching gate and a driving semiconductor layer corresponding to the first driving gate on the first insulating layer, forming driving source and drain contacting the driving semiconductor layer, switching source and drain contacting the switching semiconductor layer, and a data line perpendicularly crossing the gate line, forming a driving channel in the driving semiconductor layer between the driving source and drain, and a switching channel in the switching semiconductor layer between the switching source and drain, forming a second insulating layer on the first insulating layer to cover the driving source and drain, the driving channel, the switching source and drain, the switching channel, and the data line, forming a power line and a power electrode on the second insulating layer, the power line spaced apart from the data line and perpendicularly crossing the gate line and the power electrode extending from the power line over the driving source, forming a third insulating layer on the second insulating layer to cover the power line and the power electrode, patterning the third and second insulating layers to form a first contact hole exposing a portion of the driving drain and a second contact hole exposing the switching drain, forming a connection pattern next to the driving drain by exposing and developing a photosensitive organic layer using a mask, forming a second thin film transistor connector, a second driving gate, and a connection electrode layer on the third insulating layer, the second thin film transistor connector contacts the switching drain through the second contact hole, the second driving gate is integrally connected to the second thin film transistor connector and corresponds to the first driving gate, and the connection electrode layer completely covers the connection pattern and contacts the driving drain through the first contact hole, forming an organic light emitting diode on a second substrate, and attaching the second substrate having the organic light emitting diode to the first substrate having the connection electrode layer so as to electrically interconnect the connection electrode layer to the organic light emitting diode.

In another aspect, a dual panel-type organic electroluminescent device includes first and second substrates spaced apart from each other, a gate line disposed along a first direction on the first substrate, a pair of data lines spaced apart from each other and disposed along a second direction over the first substrate, a power line disposed between the pair of data lines along the second direction over the first substrate and defining a first pixel along with one of the pair of data lines and defining a second pixel with the other one of the pair of data lines, first and second switching thin film transistors connected to the pair of data lines in the first and second pixels, respectively, the first and second switching thin film transistors are symmetrically disposed with each other with respect to the power line, first and second driving thin film transistors connected to the power line and the corresponding switching thin film transistors, respectively, the first and second driving thin film transistors are symmetrically disposed with each other with respect to the power line, and each of the first and second driving thin film transistors includes a driving semiconductor layer, a driving source, a driving drain, a first driving gate underneath the driving semiconductor layer, and a second driving gate above the driving semiconductor, first and second power electrodes oppositely extending from the power line into the first and second pixels, respectively, and overlapping the corresponding driving sources, respectively, an electrical connector over the first substrate in each of the first and second pixels, the electrical connector including a connection electrode layer connected to the corresponding driving thin film transistor, first and second thin film transistor connectors in each of the first and second pixels, the first and second thin film transistor connectors connecting the corresponding switching thin film transistor to the corresponding driving thin film transistor, and organic electroluminescent diodes on the second substrate, each of the organic electroluminescent diodes connected to the electrical connector in each of the first and second pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
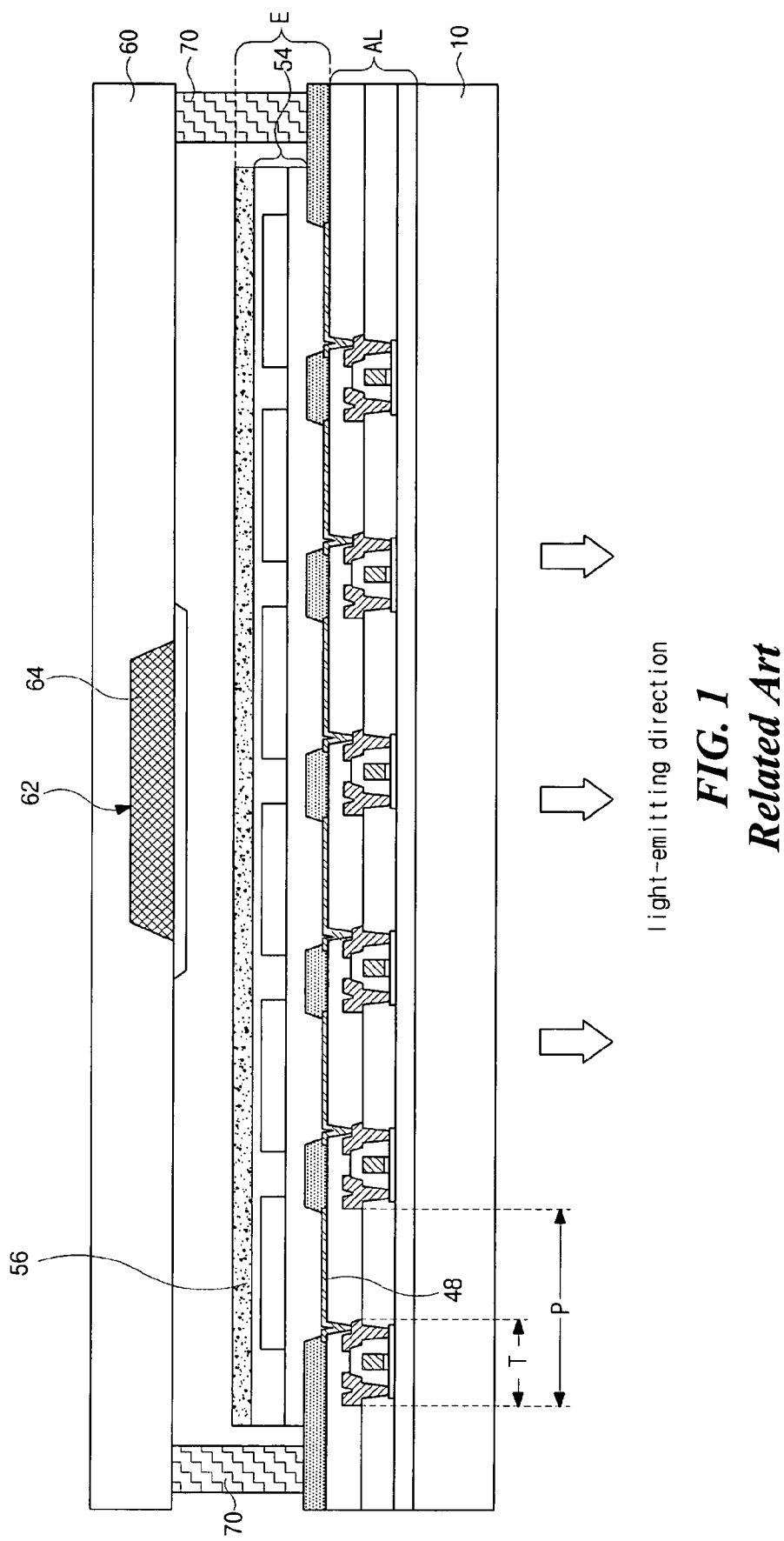
FIG. 1 is a cross sectional view of an OELD device according to the related art.
Figure 2A:
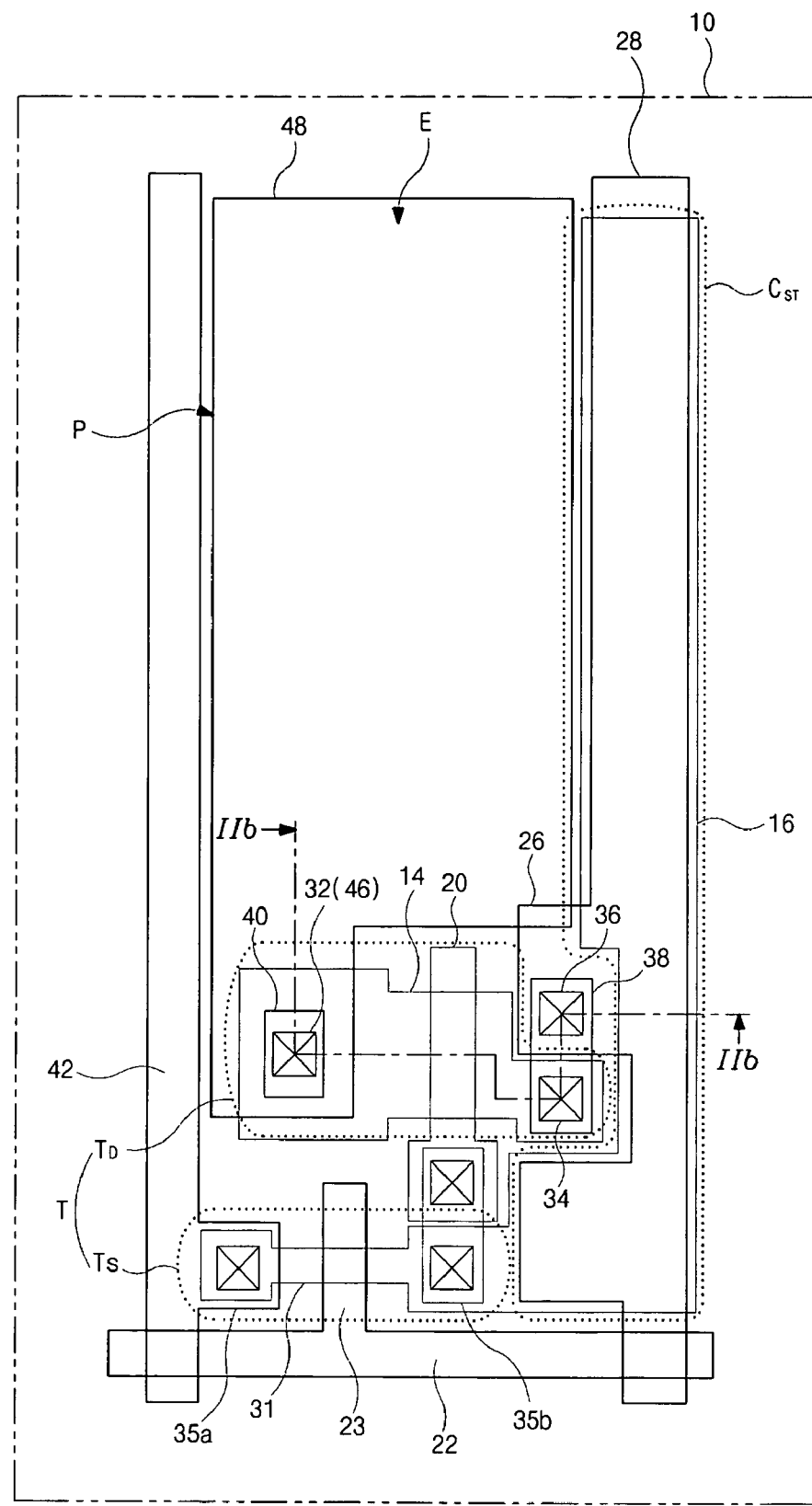
FIG. 2A is a plan view of a basic pixel structure of an active matrix OELD device according the related art.
Figure 2B:
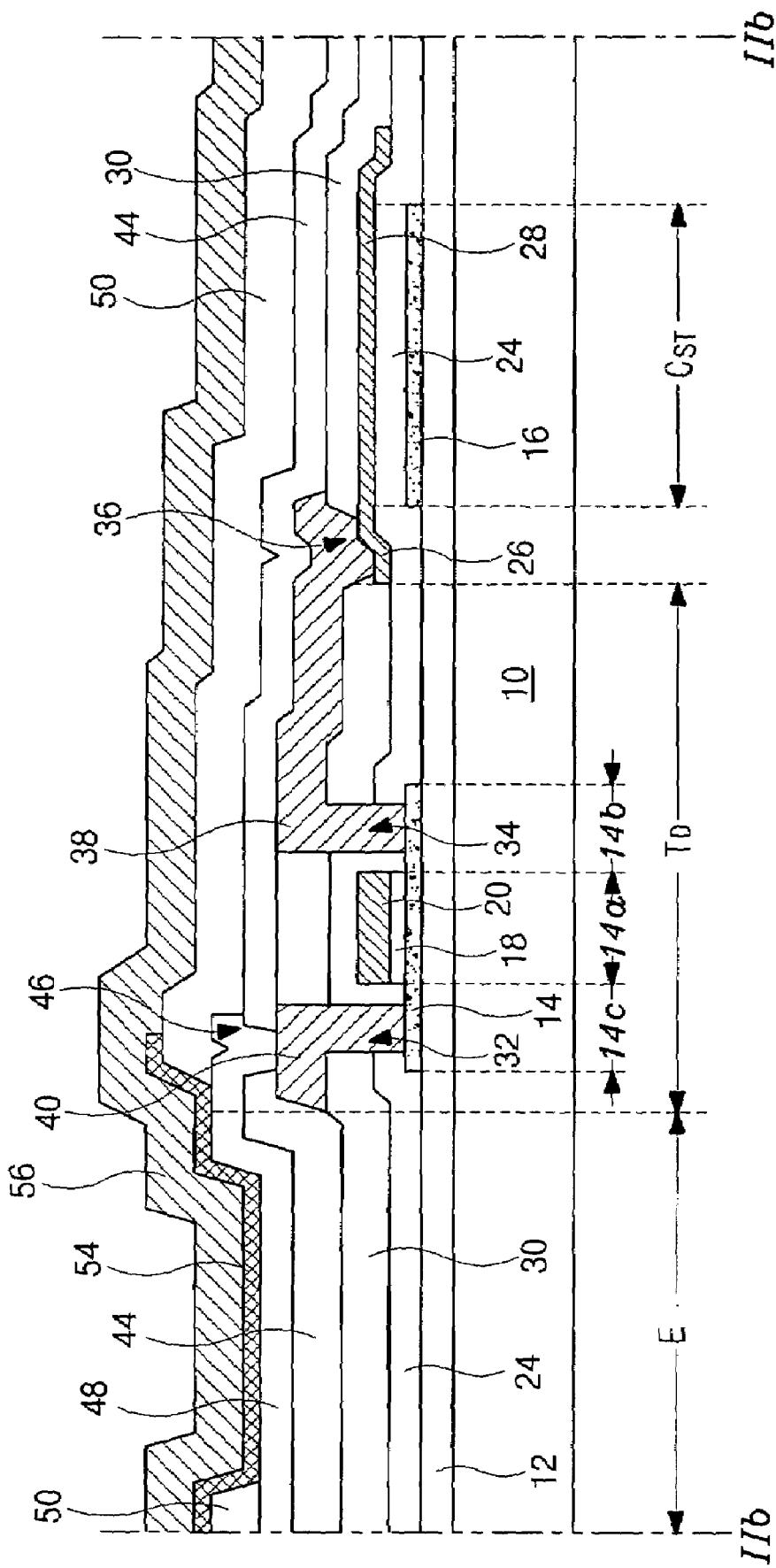
FIG. 2B is a cross sectional view along IIb—IIb of FIG. 2A showing a driving thin film transistor, a storage capacitor, and a light emitting diode according to the related art.
Figure 3:
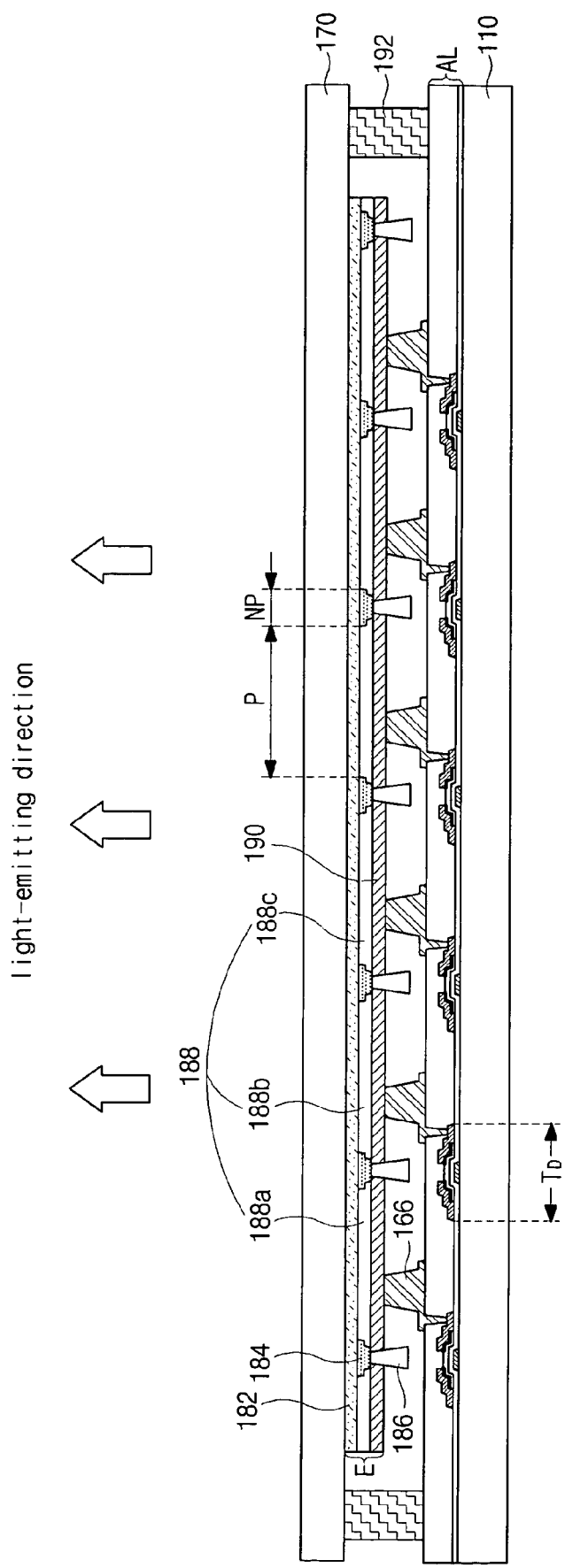
FIG. 3 is a cross sectional view of an exemplary dual panel-type OELD device according to the present invention.

FIG. 3 is a cross sectional view of an exemplary dual panel-type OELD device according to the present invention. In FIG. 3, first and second spaced-apart substrates 110 and 170 having inner surfaces facing each other may have a plurality of pixel regions P and a plurality of non-pixel region NP among the pixel regions P. An array layer AL including a driving thin film transistor (TFT) $T_D$ within each pixel region P may be formed on an inner surface of the first substrate 110. In addition, an electrical connector 166 may be formed on the array layer AL within each sub-pixel region and may be connected to the driving TFT $T_D$. The electrical connector 166 may include conductive material(s), such as metallic material(s), and may be electrically interconnect the driving TFT $T_D$ to an organic light emitting diode (LED) E. For example, the driving TFT $T_D$ may have an inverted-stagger type TFT and may include amorphous silicon or microcrystalline silicon.

In FIG. 3, a first electrode 182, such as a transparent conductive material, may be formed on an inner surface of the second substrate 170. In addition, an interlayer insulator 184 and a partition 186 may be sequentially formed on the first electrode 182, wherein the interlayer insulator 184 and the partition 186 may be disposed at a position corresponding to the non-pixel regions NP. Furthermore, the non-pixel regions NP may correspond to the driving TFT $T_D$ and a plurality of lines formed in the array layer AL, such that the non-pixel regions NP may define the pixel regions P therein. The partition 284 may have a trapezoidal cross section including tapered sidewalls.

An organic electroluminescent (EL) layer 188 including red, green, and blue organic emission layers 188a, 188b, and 188c may be alternately disposed on the first electrode 182 within each of the pixel regions P defined by the partition 186. In addition, a second electrode 190 may be formed on the organic EL layer 188 and may also be disposed within each of the pixel regions P. Thus, the organic EL layer 188 and the second electrode 190 may be separated from the organic EL layer and second electrode of an adjacent pixel region P by the partition 186.

The interlayer insulator 184 and the partition 186 may be considered to function as structural elements rendering the second electrode 190 to be self-aligned to the organic EL layer 188. In addition, the partition 186 may functions to pattern both the second electrode 190 and the organic EL layer 188 within each of the pixel regions P. Accordingly, the first electrode 182, the organic EL layer 188, and the second electrode 190 may constitute an organic light emitting diode (LED) diode E.

In FIG. 3, a sealant 192 may be formed along peripheral regions of the first and second substrates 110 and 170 for attaching the first and second substrates 110 and 170 together. Accordingly, a cell gap may be formed between the first and second substrates 110 and 170, and the electrical connector 166 on the array layer AL may contact the second electrode 190 of the organic EL diode E. Thus, the driving TFT $T_D$ on the first substrate 110 may be electrically interconnected to the organic EL diode E on the second substrate 170, although the cell gap may exist between the first and second substrates 110 and 170. For example, the electrical connector 166 may have a height equal to or greater than the cell gap.

The first electrode 182 of the organic LED E may be formed of a transparent conductive material, such as indium tin oxide (ITO), and the second electrode 190 of the organic LED E may be formed of an opaque conductive material, such as a metallic material(s), whereby light emitted from the organic LED E may be directed toward the second substrate 170. Thus, the OELD device of FIG. 3 may be considered a dual panel type OELD such that light may be emitted from top portion. In addition, although not shown, color changing mediums for full color display may be interposed between the second substrate 170 and the first electrode 182, or between the first electrode 182 and the organic EL layer 188. If the dual panel-type OELD device of FIG. 3 adopts the color changing mediums, the organic EL layer 188 emits mono-colored light, e.g., blue light or greenish light.

According to the present invention, since the array layer AL and the organic LED E may be formed on different substrates, high production efficiency and reliability may be achieved, and a high aperture ratio may be accomplished.

Figure 4A:
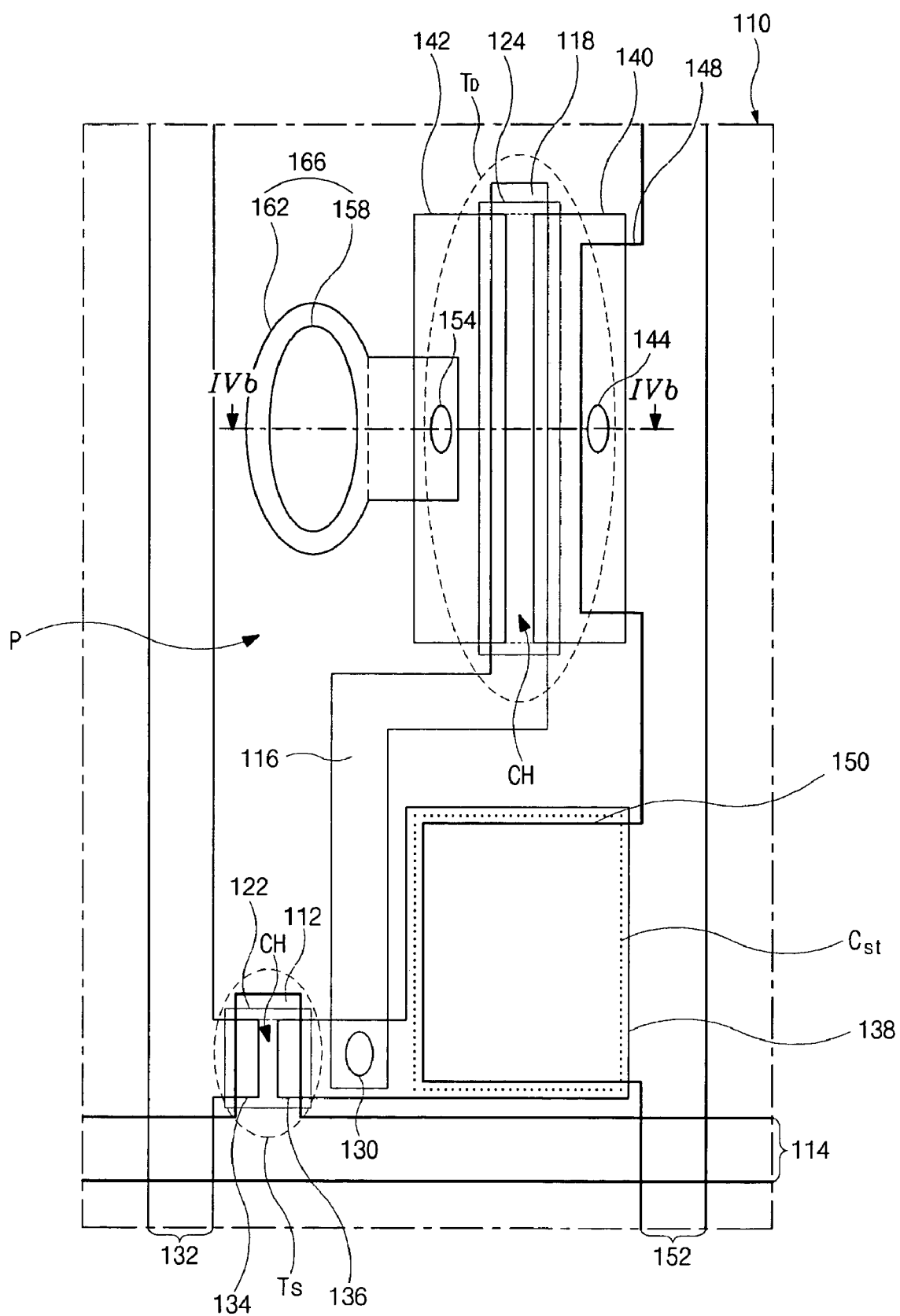
FIG. 4A is a plan view illustrating an exemplary basic pixel structure of a lower panel of FIG. 3 according to the present invention.

FIG. 4A is a plan view illustrating an exemplary basic pixel structure of a lower panel of FIG. 3 according to the present invention. In FIG. 4A, a gate line 114 may be formed on the first substrate 110 to extend along a first direction. In addition, a data line 132 and a power line 152 may be formed over the first substrate 110 extending along a second direction substantially perpendicular to the first direction. The data and power lines 132 and 152 may be spaced apart from each other and may define the pixel region P by the crossing of the gate line 114.

In FIG. 4, a switching thin film transistor (TFT) $T_S$ may be disposed near a crossing of the gate and data lines 114 and 132. In addition, a driving thin film transistor (TFT) $T_D$ may be located along an upper part of the pixel region P adjacent to the power line 152. The switching TFT $T_S$ may include a switching gate 112 that extends from the gate line 114, a switching source 134 that extends from the data line 132, a switching drain 136 spaced apart from the switching source 134 across the switching gate 112, and a switching semiconductor layer 122 over the switching gate 112.

In FIG. 4, the switching semiconductor layer 122 may have an island-shaped pattern and may be disposed between the switching source and drain 134 and 136. In addition, the switching TFT $T_S$ may include a channel CH on the switching semiconductor layer 122 between the switching source and drain 134 and 136. Although not shown, the switching semiconductor layer 122 may have a double-layered structure including an un-doped amorphous silicon layer and a doped amorphous silicon layer. In addition, the switching semiconductor layer 122 may also include microcrystalline silicon and/or amorphous silicon.

In FIG. 4A, a TFT connector 116 may be formed on the first substrate 110, and a portion of the TFT connector 116 may extend under the switching drain 136 along the second direction. Accordingly, the TFT connector 116 may contact the switching drain 136 through a first contact hole 130. A first capacitor electrode 138 may be disposed near a crossing of the gate line 114 and the power line 152, wherein the first capacitor electrode 138 may extend from the switching drain 136. In addition, a second capacitor electrode 150 extending from the power line 152 may overlap the first capacitor electrode 138. Accordingly, the first and second capacitor electrodes 138 and 150 may constitute a storage capacitor $C_{st}$ with an interposed insulator 146 (in FIG. 4B).

In addition, the driving TFT $T_D$ may include a driving gate 118, a driving semiconductor layer 124, a driving source 140, and a driving drain 142. An electrical connector 166 including a connection pattern 158 and a connection electrode layer 162 may be disposed adjacent to the driving TFT $T_D$ within the pixel region P. The driving gate 118 may be formed on the first substrate 110 and may extend from the TFT connector 116 along the second direction. The driving semiconductor layer 124 may have an island-shaped pattern and may be disposed over the driving gate 118, and the driving source and drain 140 and 142 may also have island-shaped patterns. Accordingly, the driving source 140 may be connected to a power electrode 148, which may extend from the power line 152, through a second contact hole 144, and the driving drain 142 may be connected to the connection electrode layer 162 through a third contact hole 154.

Figure 4B:
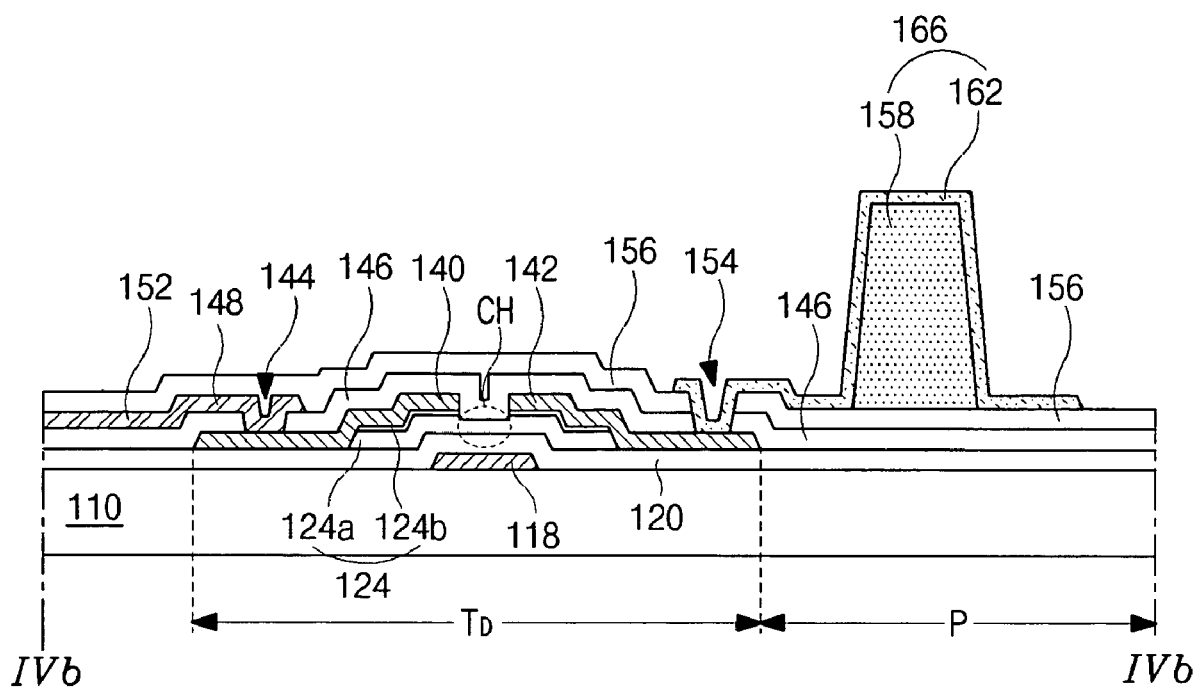
FIG. 4B is a cross sectional view taken along IVb—IVb of FIG. 4A and illustrates a layer structure of the driving TFT and the electrical pattern according to the present invention.

In FIG. 4B, the connection pattern 158 may have a pillar shape and may be formed of an insulating material, and the connection electrode layer 162 may overlap the connection pattern 158. In addition, similar to the switching TFT $T_S$, the driving TFT $T_D$ may also have a channel CH on the driving semiconductor layer 124 between the driving source and drain 140 and 142. Similarly, the driving semiconductor layer 124 may have a double-layered structure including an un-doped amorphous silicon layer 124a (in FIG. 4B) and a doped amorphous silicon layer 124b (in FIG. 4B), and the driving semiconductor layer 124 may be formed of microcrystalline silicon and/or amorphous silicon.

FIG. 4B is a cross sectional view taken along IVb—IVb of FIG. 4A and illustrates a layer structure of the driving TFT and the electrical pattern according to the present invention. In FIG. 4B, the driving gate 118 may be formed on the substrate 110 and a gate insulating layer 120 may be formed on the substrate 110 to cover the driving gate 118. As shown in FIG. 4A, the gate insulating layer 120 has the first contact hole 130 through which the switching drain 136 contacts the TFT connector 116. The driving semiconductor layer 124 may be formed on the gate insulating layer 120, especially over the driving gate 118, and may include an active layer 124a of un-doped amorphous silicon and an ohmic contact layer 124b of doped amorphous silicon. Alternatively, the active layer 124a may be formed of microcrystalline silicon instead of the amorphous silicon.

In FIG. 4B, the driving source and drain 140 and 142 may be formed over the gate insulating layer 120 to contact the ohmic contact layer 124b, wherein the driving source and drain 140 and 142 may be spaced apart from each other. In addition, a portion of the ohmic contact layer 124b between the driving source and drain 140 and 142 may be removed to expose a portion of the underlying active layer 124a, thereby forming a channel CH within the active layer 124a. Accordingly, the driving TFT $T_D$ is formed on the substrate 110, and includes the driving gate 118, the driving semiconductor layer 124, the driving source 140, and the driving drain 142.

In FIG. 4B, a first passivation layer 146 may be formed over the gate insulating layer 120 to cover the driving source and drain 140 and 142. In addition, the first passivation layer 146 may have the second contact hole 144 that exposes a portion of the driving source 140.

The power line 152 and the power electrode 148 may be formed on the first passivation layer 146, wherein the power line 152 perpendicularly crosses the gate line 114, as shown in FIG. 4A. The power electrode 148 may extend from the power line 152 over the driving source 140, and may contact the driving source 140 through the second contact hole 144.

In FIG. 4B, a second passivation layer 156 may be formed on the first passivation layer 146 to cover the power line 152 and electrode 148, wherein the first and second passivation layers 146 and 156 may have the third contact hole 154 that exposes a portion of the driving drain 142. In addition, the connection pattern 158 may be formed on the second passivation layer 156 within the pixel region P adjacent to the driving TFT $T_D$, wherein the connection pattern 158 includes an insulating material, such as an organic insulating material or a photosensitive organic material. The connection electrode layer 162 may be formed over the second passivation layer 156 to overlap the connection pattern 158, and may contact the driving drain 142 through the third contact hole 154. The connection pattern 158 and the connection electrode layer 162 constitute the electrical connector 166. In addition, the connection pattern 158 may have a height greater than the driving TFT $T_D$ so as to make the overlying connection electrode layer 162 contact the second electrode 190 of the organic LED E, as shown in FIG. 3.

Figure 5A:
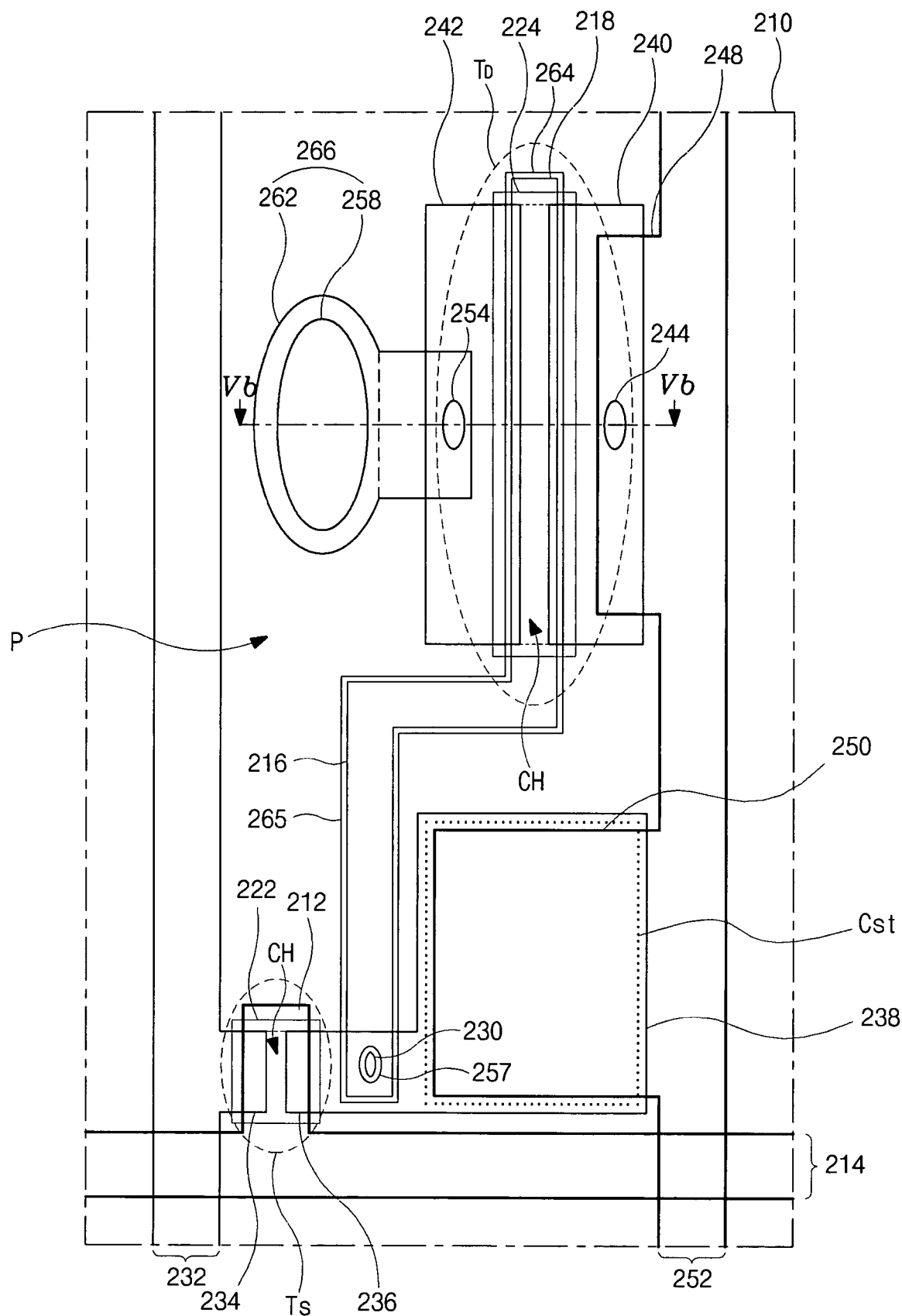
FIG. 5A is a plan view illustrating another exemplary basic pixel structure of the lower panel of FIG. 3 according to the present invention.

FIG. 5A is a plan view illustrating another exemplary basic pixel structure of the lower panel of FIG. 3 according to the present invention. The lower panel shown in FIG. 5A may have a layer structure similar to that shown in FIG. 4A, but may include some differences. In FIG. 5A, a gate line 214 may be formed on a substrate 210 along a first direction, and a data line 232 and a power line 252 are formed over the substrate 210 along a second direction substantially perpendicular to the first direction. The data and power lines 232 and 252 may be spaced apart from each other to define the pixel region P by the crossing of the gate line 214.

A switching thin film transistor (TFT) $T_S$ may be disposed near a crossing of the gate and data lines 214 and 232. In addition, a driving thin film transistor (TFT) $T_D$ may be located within the pixel region P adjacent to the power line 252. The switching TFT $T_S$ may include a switching gate 212 that extends from the gate line 214, a switching source 234 that extends from the data line 232, a switching drain 236 that is spaced apart from the switching source 234 across the switching gate 232, and a switching semiconductor layer 222 disposed over the switching gate 212. The switching semiconductor layer 222 may have an island-shape pattern and may be disposed between the switching source and drain 234 and 236. In addition, the switching TFT $T_S$ may include a channel CH in the switching semiconductor layer 222 between the switching source and drain 234 and 236. Although not shown, the switching semiconductor layer 222 may have a double-layered structure including an un-doped amorphous silicon layer and a doped amorphous silicon layer. The switching semiconductor layer 222 may also include microcrystalline silicon and/or amorphous silicon.

In FIG. 5A, a first TFT connector 216 may be formed on the substrate 210 under the switching drain 236 along the second direction. Furthermore, a second TFT connector 265 may be formed to overlap the first TFT connector 216, unlike the lower panel shown in FIG. 4A. The second TFT connector 265 may be simultaneously formed of the same material as a connection electrode layer 262. Accordingly, the first TFT connector 216 may contact the switching drain 236 through a first contact hole 230, and the second TFT connector 265 may contact the switching drain 236 through a fourth contact hole 257.

A first capacitor electrode 238 may extend from the switching drain 236 and may be disposed adjacent to a crossing of the gate and power lines 214 and 252. In addition, a second capacitor electrode 250 may extend from the power line 252 and may overlap the first capacitor electrode 238. Accordingly, the first and second capacitor electrodes 238 and 250 may constitute a storage capacitor $C_{st}$ with an interposed insulator 246 (in FIG. 5B).

In addition, a driving TFT $T_D$ may include a first driving gate 218, a driving semiconductor layer 224, a driving source 240, a driving drain 242, and a second driving gate 264. In addition, an electrical connector 266 including a connection pattern 258 and a connection electrode layer 262 may be disposed within the pixel region P adjacent to the driving TFT $T_D$. The first driving gate 218 may extend from the first TFT connector 216 along the second direction and may be disposed on the substrate 210. Moreover, the driving semiconductor layer 224 may have an island-shaped pattern and may be disposed over the first driving gate 218, wherein the driving source and drain 240 and 242 may also have island-shaped patterns.

Figure 5B:
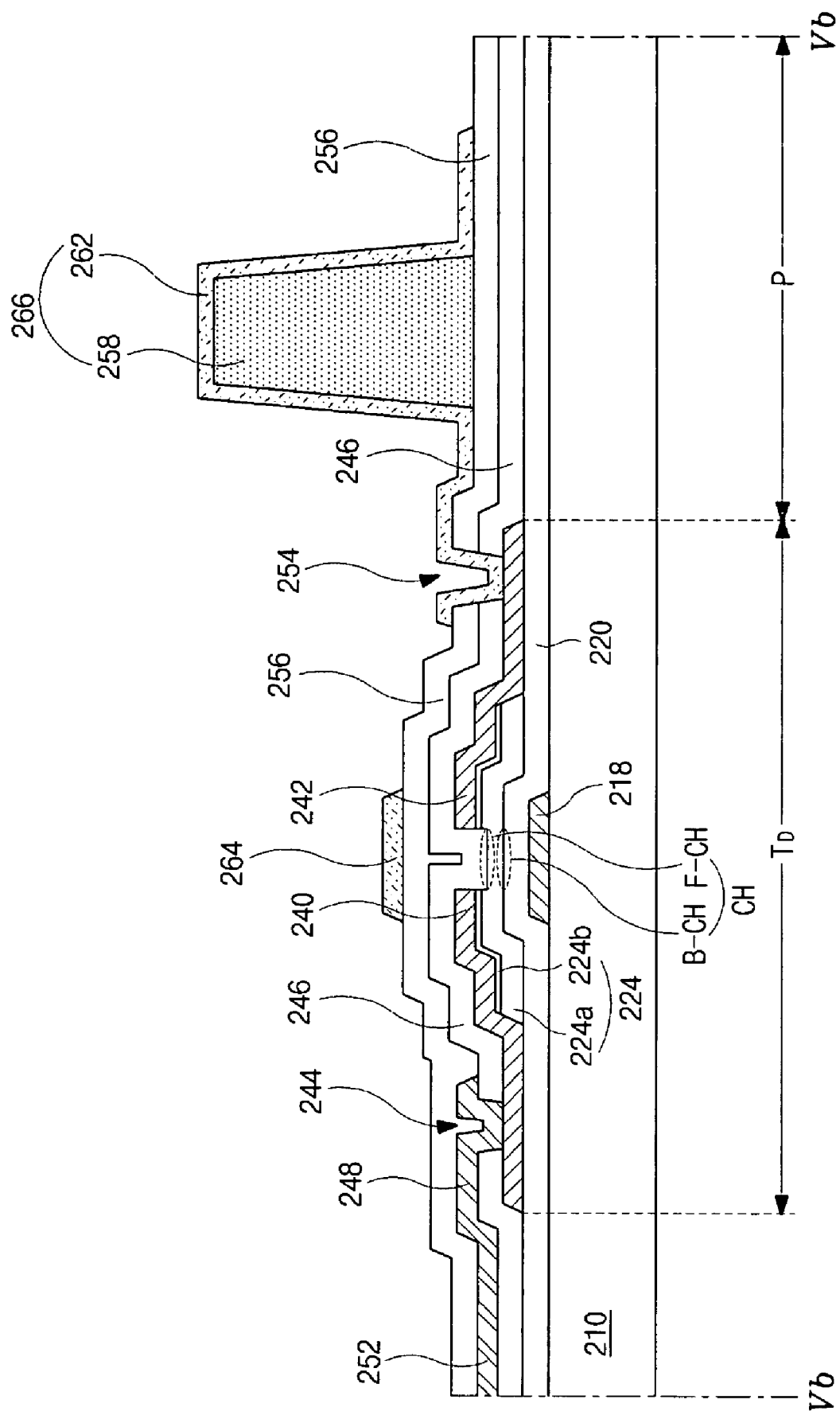
FIG. 5B is a cross sectional view taken along Vb—Vb of FIG. 5A and illustrates a layer structure of the driving TFT and the electrical pattern according to the present invention.

In FIG. 5A, the driving source 240 may be connected to a power electrode 248 that may extend from the power line 252 through a second contact hole 244, and the driving drain 242 may be connected to the connection electrode layer 262 through a third contact hole 254. In addition, the second driving gate 264 may extend from the second TFT connector 265 and may overlap the first driving gate 218, and the second driving gate 264 and the connection electrode layer 262 may be simultaneously formed of the same material. As shown in FIG. 5B, the connection pattern 258 may have a pillar shape and may be formed of an insulating material, and the connection electrode layer 262 may overlap the connection pattern 258.

In FIG. 5A, similar to the switching TFT $T_S$, the driving TFT $T_D$ may also have a channel CH in the driving semiconductor layer 224 between the driving source and drain 240 and 242. The driving semiconductor layer 224 may have a double-layered structure including an un-doped amorphous silicon layer 224a (in FIG. 5B) and a doped amorphous silicon layer 224b (in FIG. 5B), and the driving semiconductor layer 224 may include microcrystalline silicon and/or amorphous silicon.

FIG. 5B is a cross sectional view taken along Vb—Vb of FIG. 5A and illustrates a layer structure of the driving TFT and the electrical pattern according to the present invention. The driving TFT of FIG. 5B may be similar to that of FIG. 4B, but may have a dual gate structure different from that of FIG. 4B. In FIG. 5B, the driving gate 218 may be formed on the substrate 210, and a gate insulating layer 220 may be formed on the substrate 210 to cover the driving gate 218. As shown in FIG. 5A, the first TFT connector 216 may also be formed on the substrate 210, and the gate insulating layer 220 may also cover the first TFT connector 216. Furthermore, the gate insulating layer 220 may have the first contact hole 230 (in FIG. 5A) through which the switching drain 236 contacts the first TFT connector 216.

In FIG. 5B, the driving semiconductor layer 224 may be formed on the gate insulating layer 220, especially over the driving gate 218, and the driving semiconductor layer 224 may include an active layer 224a of un-doped amorphous silicon and an ohmic contact layer 224b of doped amorphous silicon. Alternatively, the active layer 224a may be formed of microcrystalline silicon instead of amorphous silicon.

The driving source and drain 240 and 242 may be formed over the gate insulating layer 220 to contact the ohmic contact layer 224b, wherein the driving source and drain 240 and 242 may be spaced apart from each other. In addition, a portion of the ohmic contact layer 224b between the driving source and drain 240 and 242 may be removed to expose a portion of the underlying active layer 224a, thereby forming the channel CH in the active layer 224a. Accordingly, the driving TFT $T_D$ may be formed on the substrate 210 and may include the driving gate 218, the driving semiconductor layer 224, the driving source 240, and the driving drain 242.

In FIG. 5B, a first passivation layer 246 may be formed over the gate insulating layer 220 to cover the driving source and drain 240 and 242, and the first passivation layer 246 may include the second contact hole 244 that exposes a portion of the driving source 240. In addition, the power line 252 and the power electrode 248 may be formed on the first passivation layer 246, wherein the power line 252 may perpendicularly cross the gate line 214, as shown in FIG. 5A. Accordingly, the power electrode 248 may extend from the power line 252 over the driving source 240, and may contact the driving source 240 through the second contact hole 244.

A second passivation layer 256 may be formed on the first passivation layer 246 to cover the power line 252 and electrode 248. Accordingly, the first and second passivation layers 246 and 256 may have the third contact hole 254 that exposes a portion of the driving drain 242. As shown in FIG. 5A, the first and second passivation layers 246 and 256 may further have the fourth contact hole 257 that exposes a portion of the switching drain 236.

In FIG. 5B, the connection pattern 258 may be formed on the second passivation layer 256 within the pixel region P adjacent to the driving TFT $T_D$, and the connection pattern 258 may include an insulating material, such as an organic insulating material or a photosensitive organic material. The connection electrode layer 262 may be formed on the second passivation layer 256 to overlap the connection pattern 258, and the connection electrode layer 262 may contact the driving drain 242 through the third contact hole 254. Accordingly, the connection pattern 258 and the connection electrode layer 262 may constitute the electrical connector 266. In addition, the connection pattern 258 may have a height greater than the driving TFT $T_D$ so as to make the overlying connection electrode layer 262 contact the second electrode of the organic LED, as shown in FIG. 3. In addition, the second driving gate 264 is formed on the second passivation layer 256.

As shown in FIG. 5A, the second driving gate 264 may extend from the second TFT connector 265 that contacts the switching drain 236 through the fourth contact hole 257, whereby the second driving gate 264 electrically communicates with the switching TFT $T_S$ as the first driving gate 218 does. In addition, the second driving gate 264 may overlap the first driving gate 218 and may have a same plane shape as the first driving gate 218. Furthermore, the second driving gate 264 may be simultaneously formed of the same material as the connection electrode layer 262.

In FIGS. 5A and 5B, the first and second driving gates 218 and 264 may be disposed underneath the active layer 224a and above the active layer 224a, respectively. Therefore, the channel CH may be divided into a back channel B-CH and a front channel F-CH. Accordingly, the first driving gate 218 may effect the front channel F-CH disposed between the driving source 246 and gate 242, while the second driving gate 264 may effect the back channel B-CH disposed between the driving source 246 and gate 242. Thus, the driving TFT $T_D$ may accelerate carrier movement within the channel CH due to the double gate structure of first and second driving gates 218 and 264.

Figure 6A:
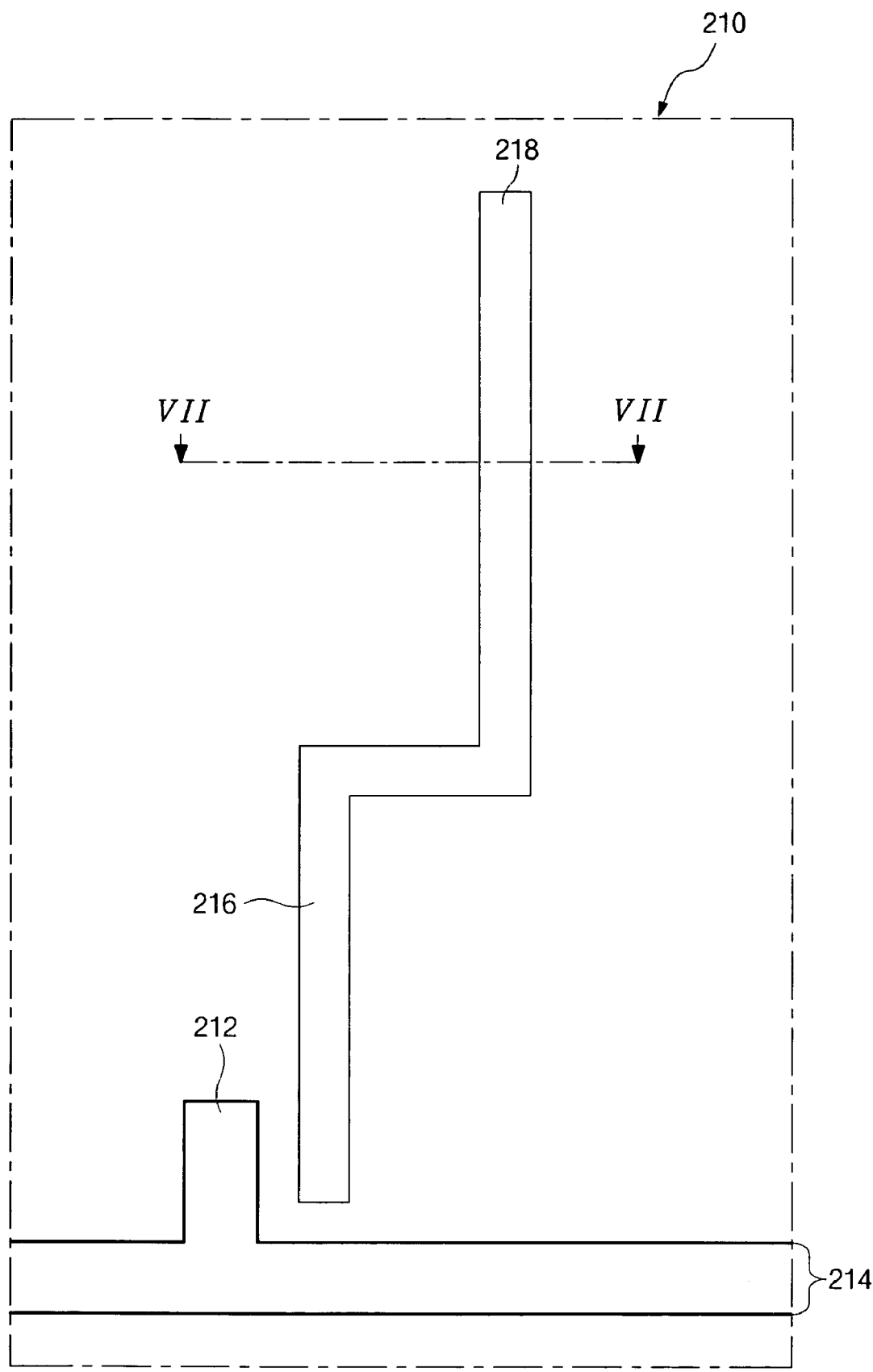
FIGS. 6A–6I are plane views showing a fabricating process of a basic pixel structure of FIG. 5A according to the present invention.
Figure 6B:
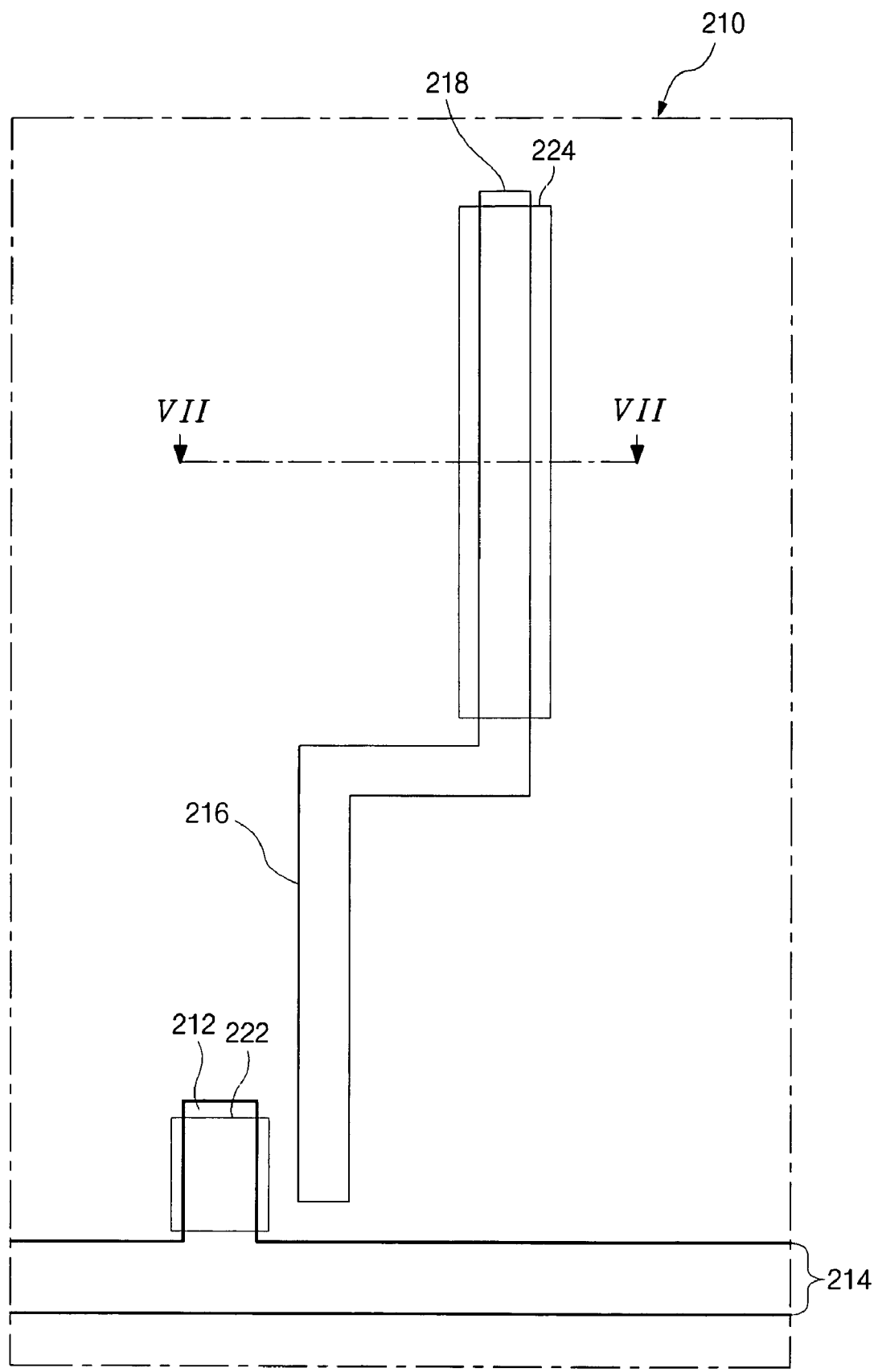
Figure 6C:
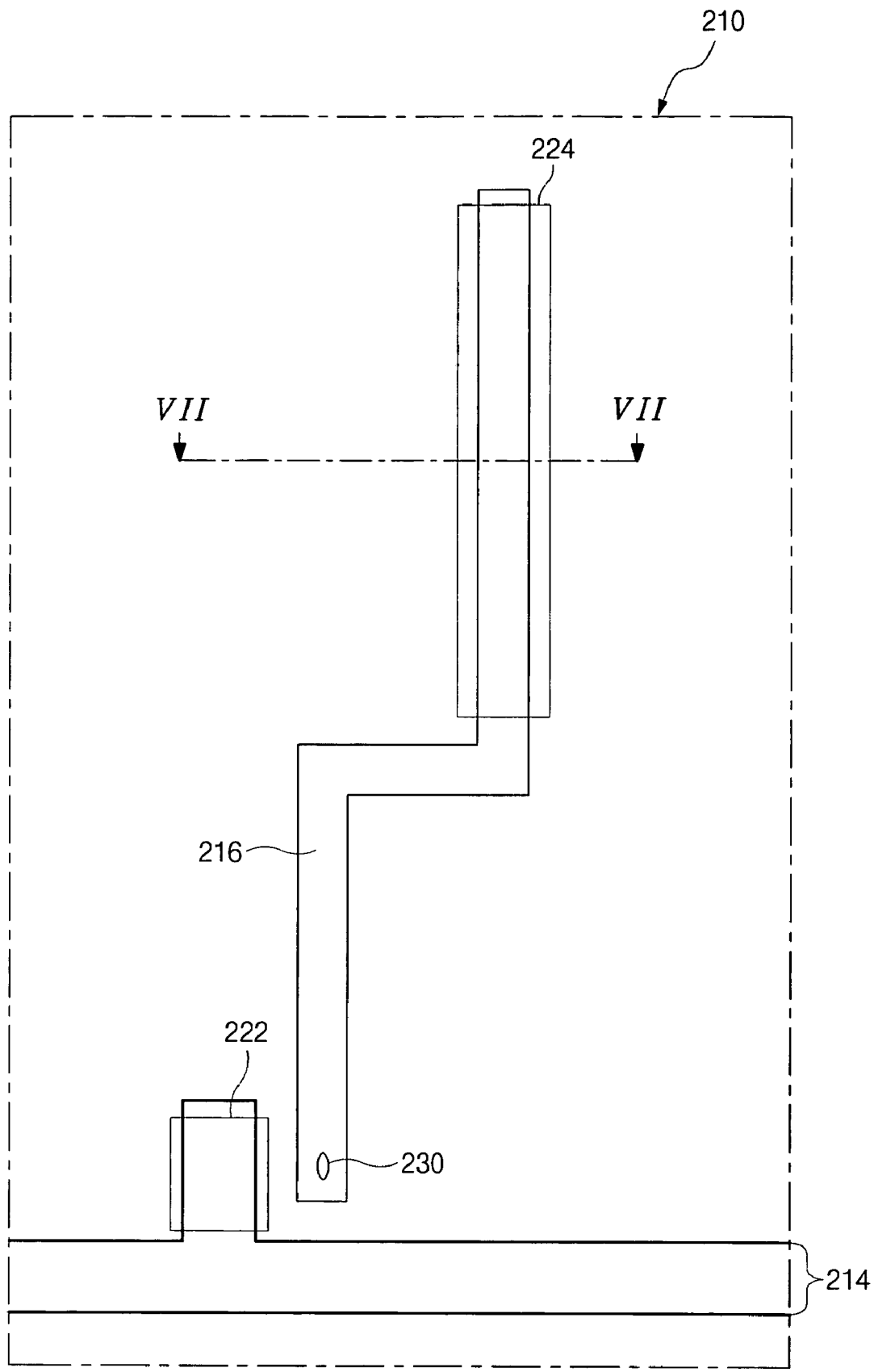
Figure 6D:
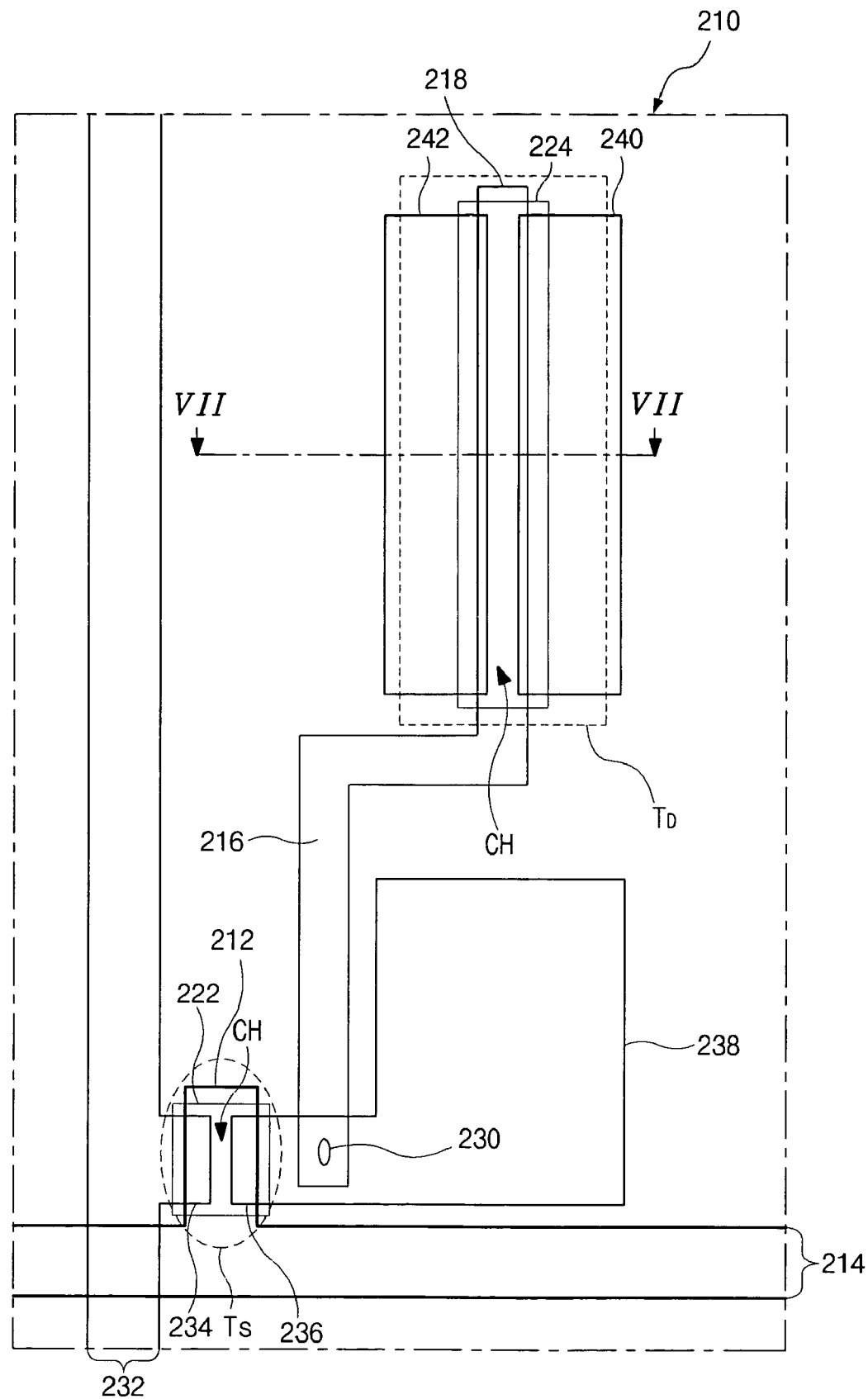
Figure 6E:
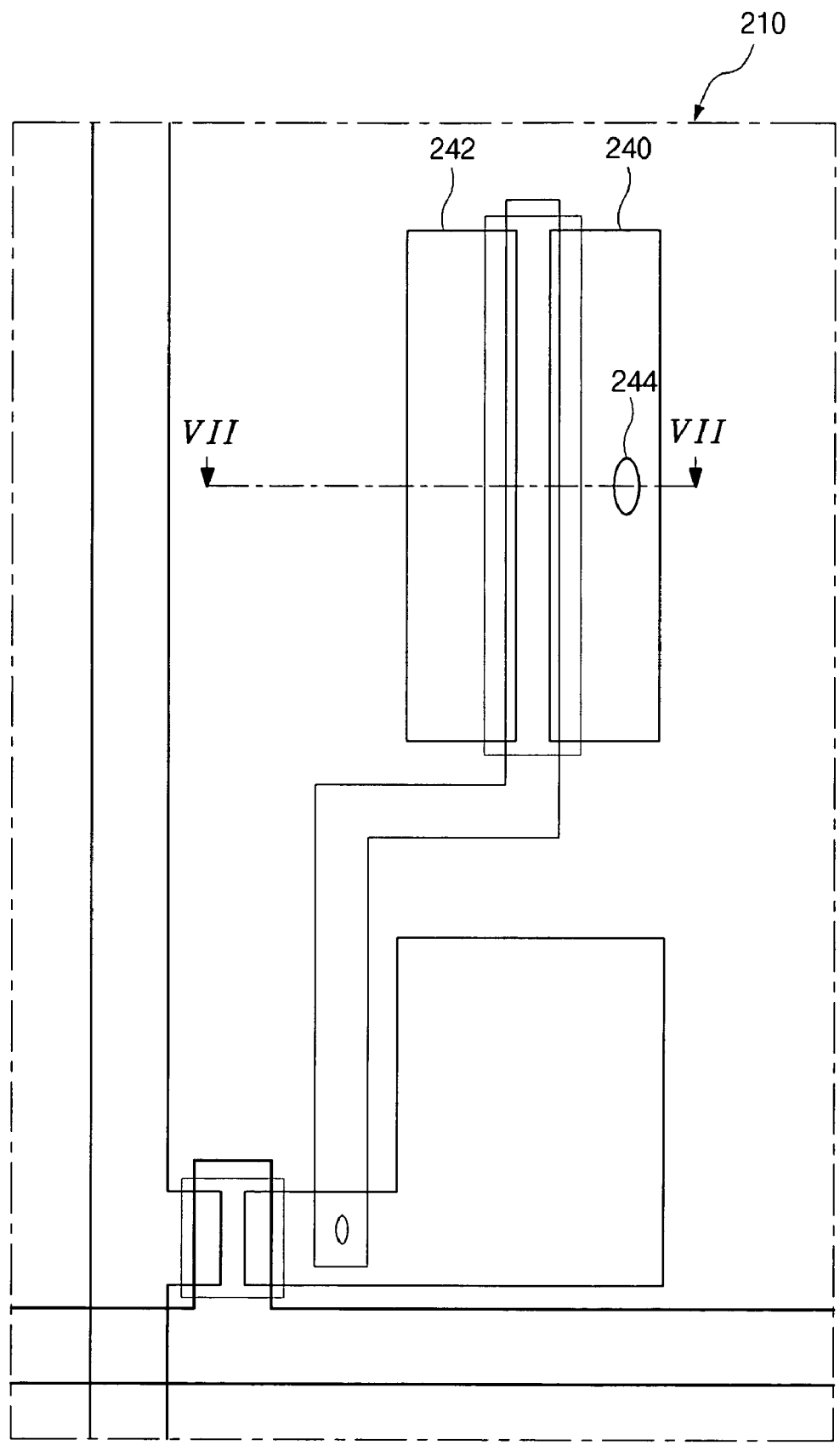
Figure 6:
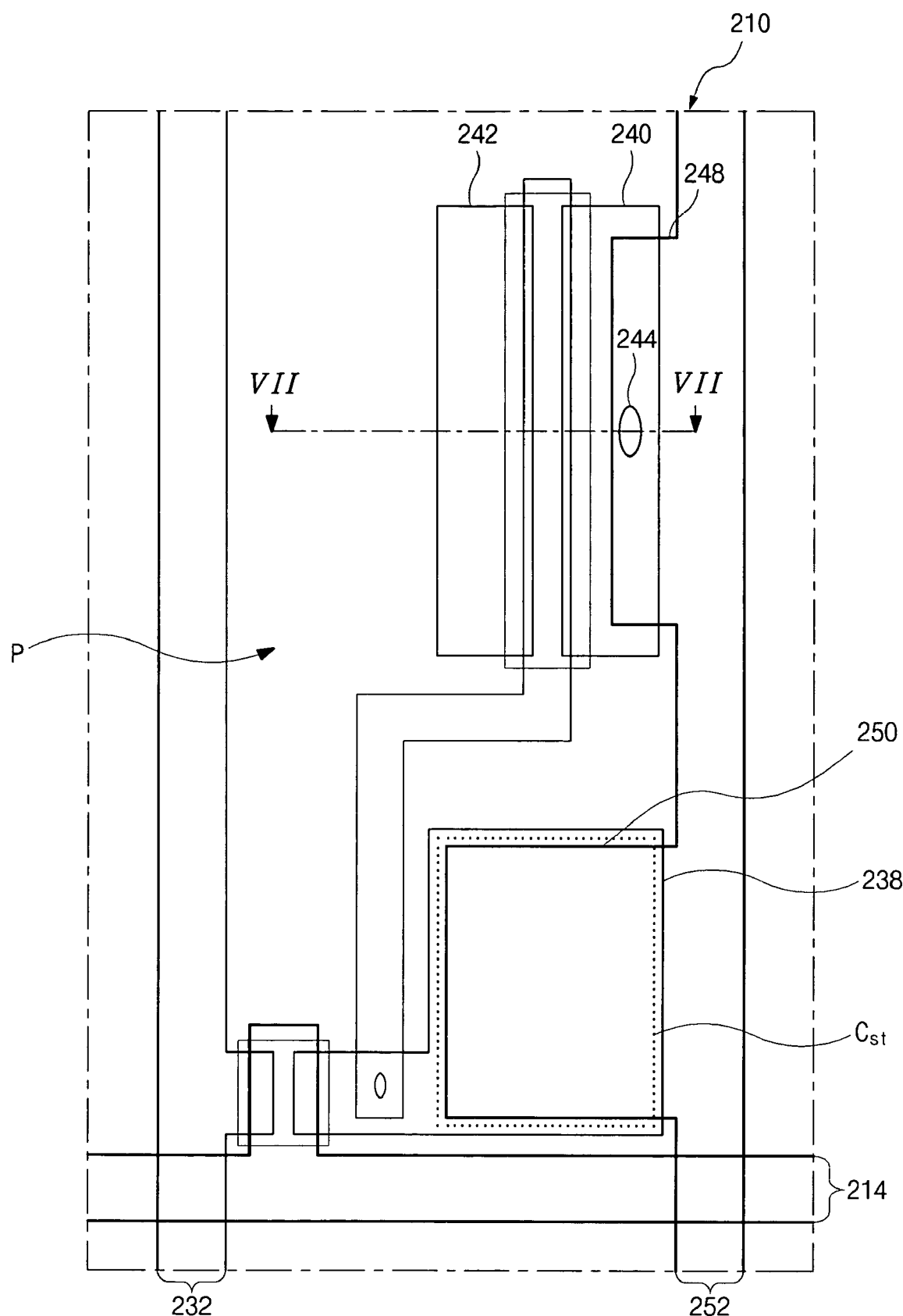
Figure 6G:
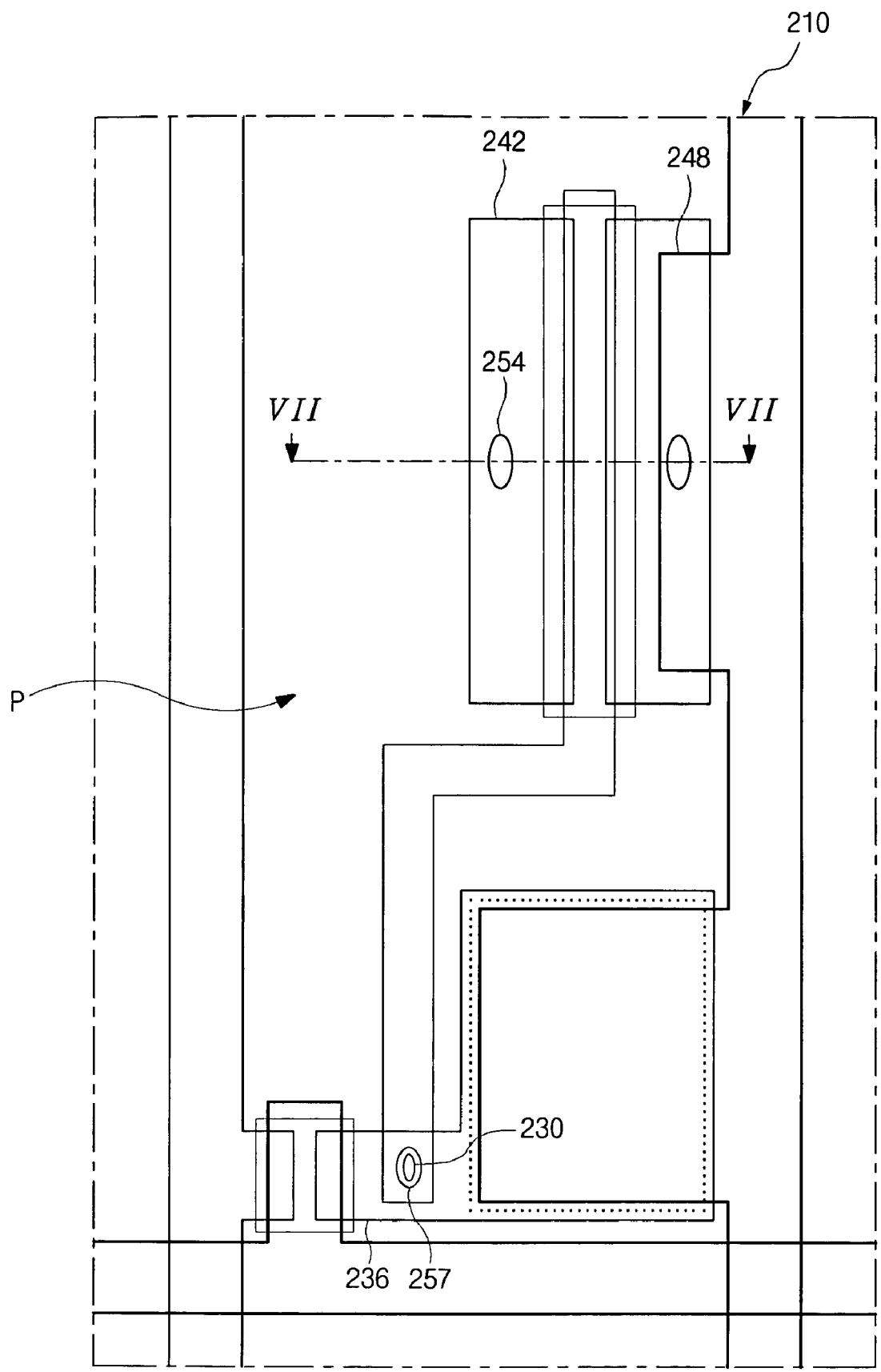
Figure 6H:
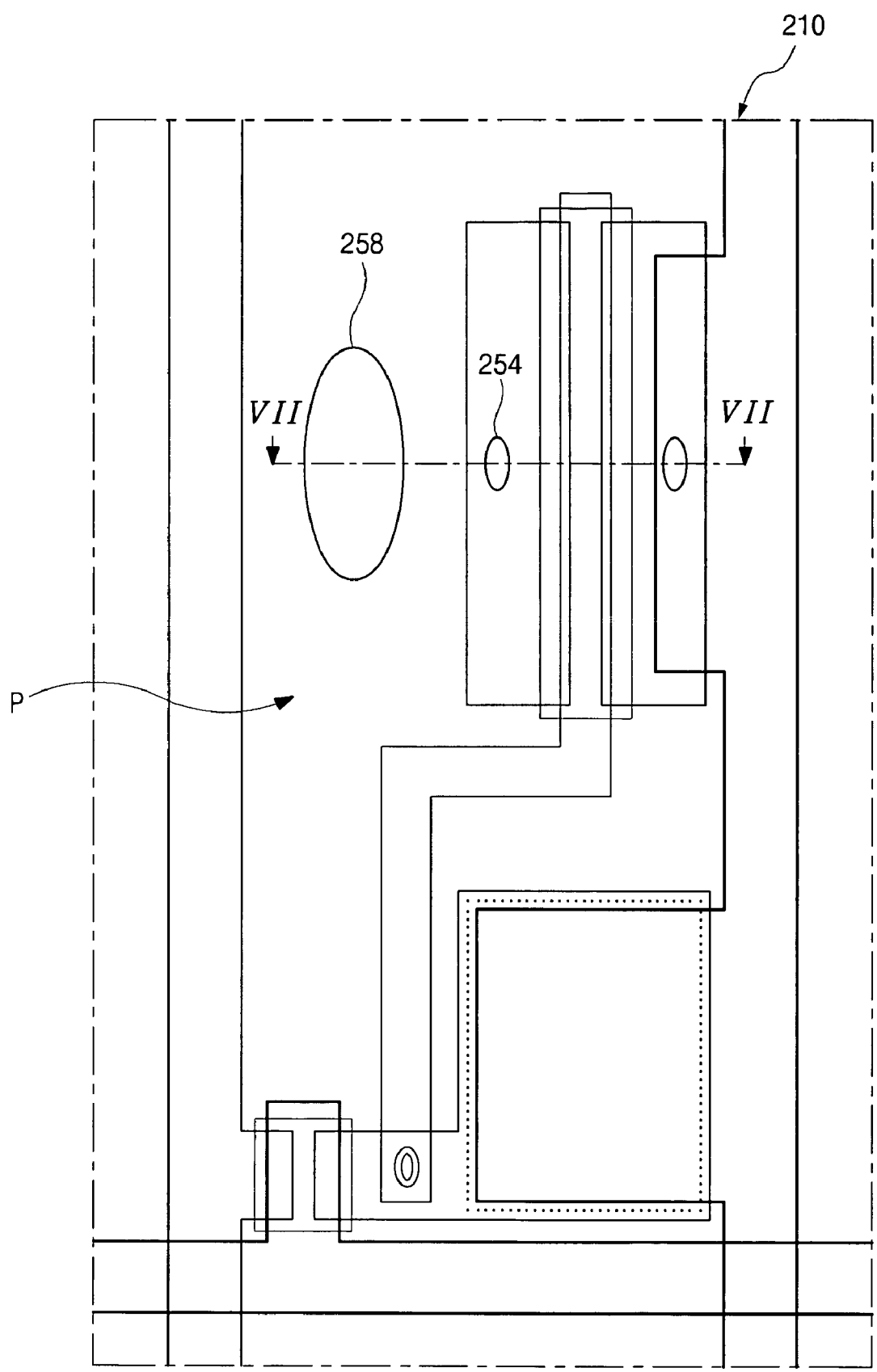
Figure 6I:
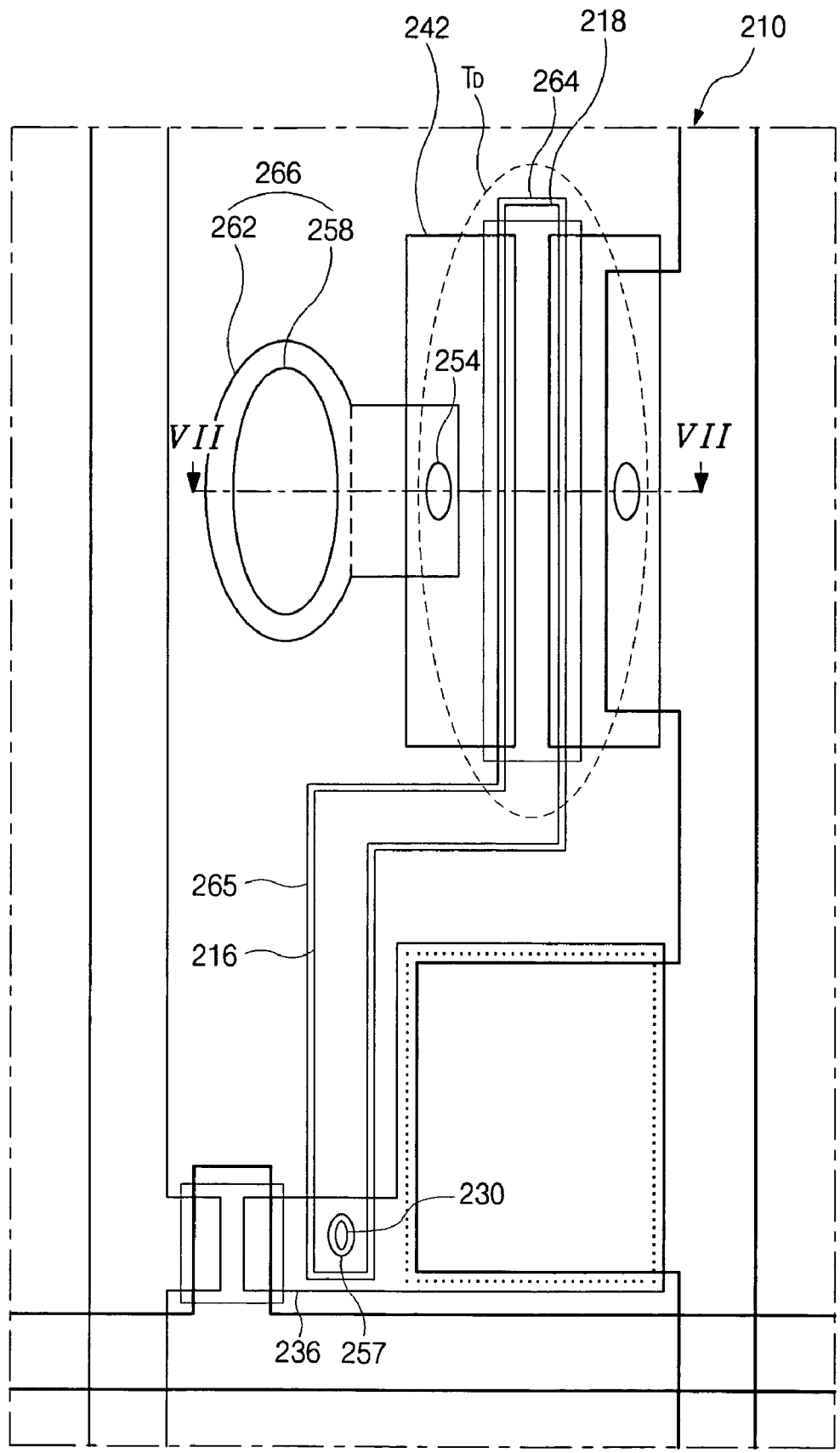
Figure 7A:
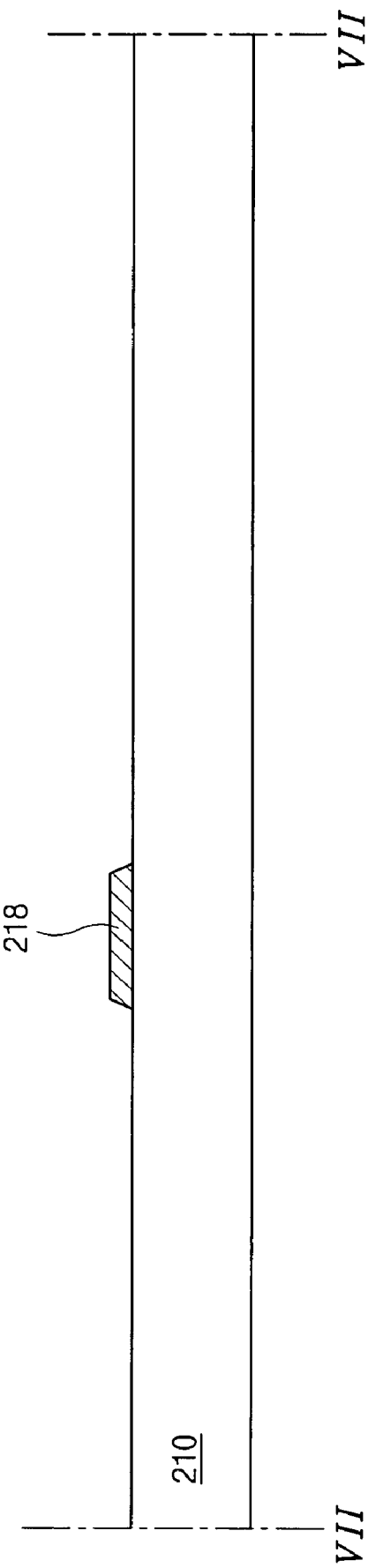
FIGS. 7A–7I are cross sectional views taken along lines VII—VII of FIGS. 6A–6I illustrating a fabricating process of the driving TFT according to the present invention.

FIGS. 6A–6I are plane views showing a fabricating process of a basic pixel structure of FIG. 5A according to the present invention, and FIGS. 7A–7I are cross sectional views taken along lines VII—VII of FIGS. 6A–6I illustrating a fabricating process of the driving TFT according to the present invention. In FIGS. 6A and 7A, a first metal layer may be formed on a substrate 110, and then patterned to form a driving gate 218. Furthermore, a gate line 214, a switching gate 212, and a first TFT connector 216 may also be formed on the substrate 110 during the process step after patterning of the first metal layer. Accordingly, the gate line 214 may be disposed to extend along a first direction, and the switching gate 212 may extend from the gate line 214 along a second direction substantially perpendicular to the first direction. In addition, the first TFT connector 216 and the driving gate 218 may be disposed along the second direction, and may be connected to each other. As shown in FIG. 6A, the first TFT connector 216 and the driving gate 218 may be spaced apart from the gate line 214 and electrode 212.

Figure 7B:
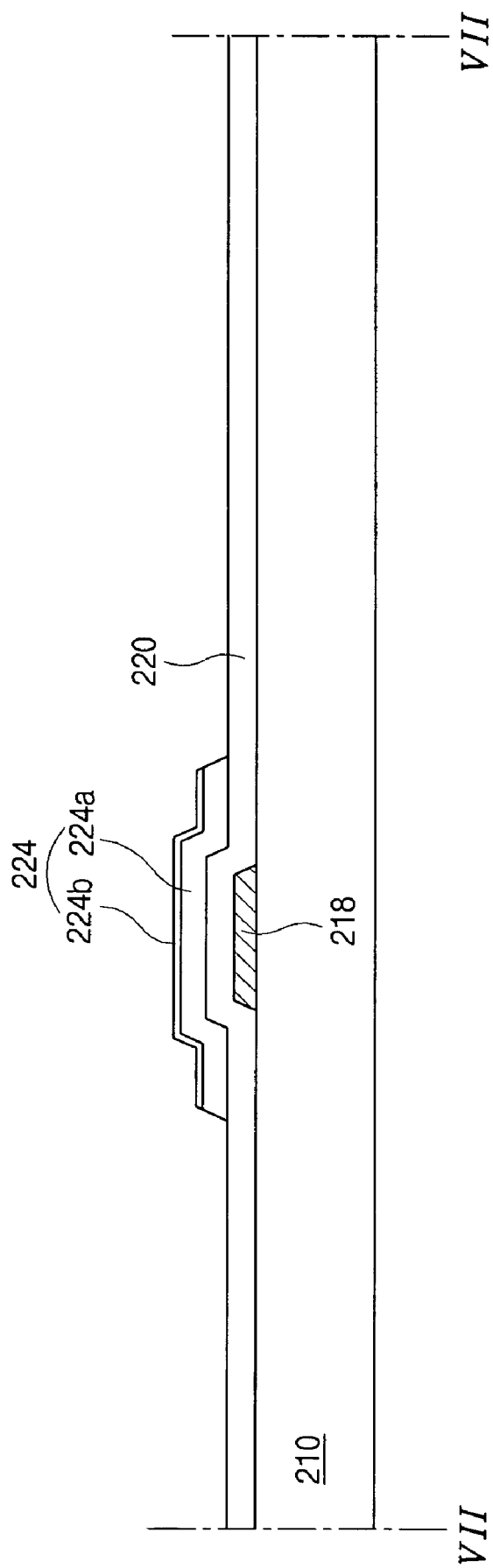

In FIGS. 6B and 7B, a first insulating layer 220, such as a gate insulating layer, may be formed on the substrate 210 to cover the gate line 214, the switching gate 212, the first TFT connector, and the driving gate 218. Then, an un-doped amorphous silicon (a-Si) layer and a doped amorphous silicon (n+a-Si) layer may be formed on the first insulating layer 220, and then simultaneously patterned using a photolithography process to form a switching semiconductor layer 222 over the switching gate 212 and a driving semiconductor layer 224 over the diving gate 218.

The switching and driving semiconductor layers 222 and 224 may have island-shaped patterns shapes. The driving semiconductor layer 224 may include an active layer 224a of un-doped amorphous silicon and an ohmic contact layer 224b of doped amorphous silicon. Although not shown in FIGS. 6B and 7B, the switching semiconductor layer 222 may also include an active layer of un-doped amorphous silicon and an ohmic contact layer of doped amorphous silicon. However, microcrystalline silicon may be adopted instead of amorphous silicon. In addition, the first insulating layer 220 may include an inorganic material selected from a group including silicon nitride ($SiN_X$) and silicon oxide ($SiO_2$), for example.

Figure 7C:
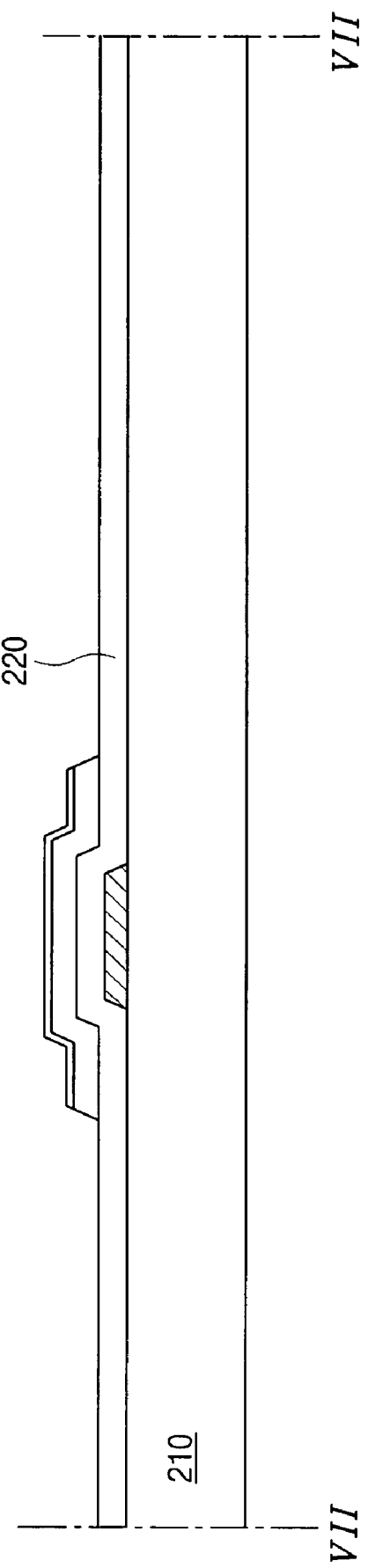

In FIGS. 6C and 7C, the first insulating layer 220 may be patterned to form a first contact hole 230 that exposes a portion of the first TFT connector 216. The process step of forming the first contact hole 230 may be performed prior to the process step of forming the switching and driving semiconductor layers 222 and 224.

Figure 7D:
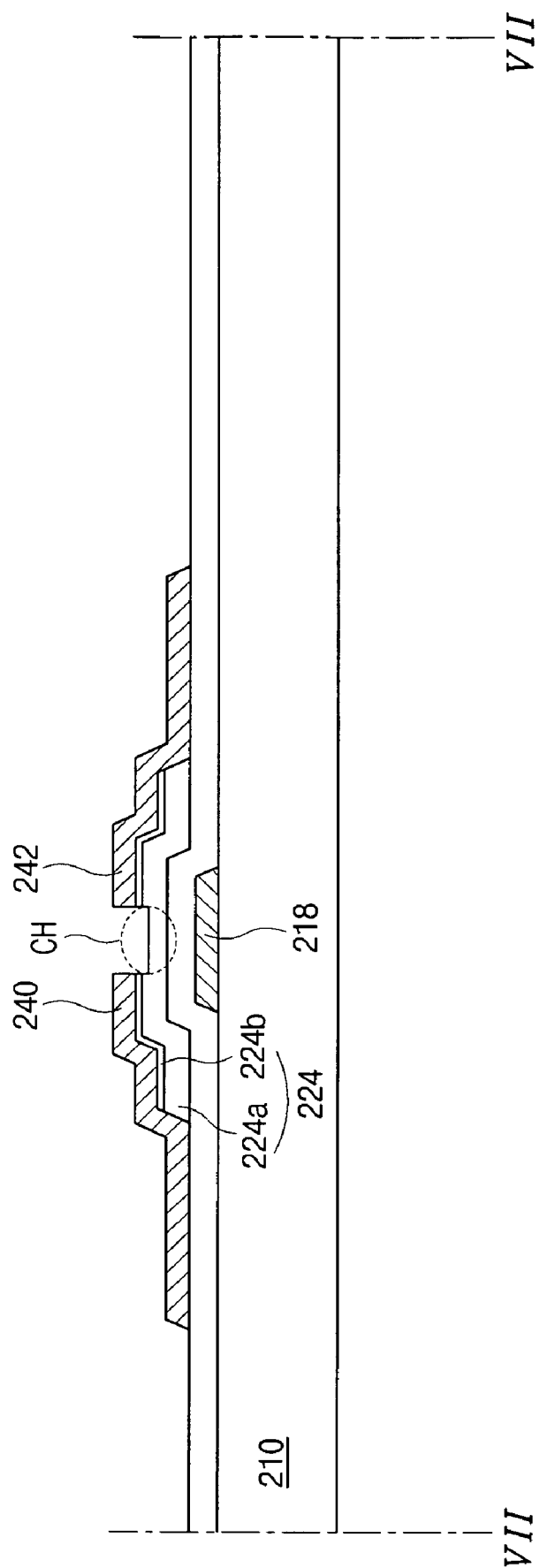

In FIGS. 6D and 7D, a second metal layer may be formed on the first insulating layer 220 to cover the switching and driving semiconductor layers 222 and 224, and then patterned to form a driving source 240 and a driving drain 242 using a mask process. In addition, a data line 232, a switching source 234, a switching drain 236 and a first capacitor electrode 238 may also be simultaneously formed. The driving source and drain 240 and 242 may be formed having island-shaped patterns to contact the driving semiconductor layer 224, and may be spaced apart from each other across the driving gate 218. The data line 232 may be formed to perpendicularly cross the gate line 214. The switching source 234 may extend from the data line 232 to contact one end portion of the switching semiconductor layer 222, and the switching drain 236 may be spaced apart from the switching source 234 and contacts the other end portion of the switching semiconductor layer 222.

The first capacitor electrode 238 may extend from the switching drain 236, and may be substantially rectangular-shaped. In addition, the switching drain 236 may overlap the first TFT connector 216 and may contact the first TFT connector 216 through the first contact hole 230, whereby the driving gate 218 may be connected to the switching drain 236 through the first TFT connector 216.

After forming the driving source and drain 240 and 242, a portion of the ohmic contact layer 224b exposed between the driving source and drain 240 and 242 may be removed using the driving source 240 and drain 242 as masks. Accordingly, a portion of the active layer 224a may be exposed, thereby forming a channel CH between the driving source and drain 240 and 242. In this manner, a portion of the ohmic contact layer of the switching semiconductor layer 222 may also be removed using the switching source 234 and drain 236 as masks, thereby additionally forming a channel CH between the switching source 234 and drain 236. Accordingly, a driving thin film transistor (TFT) $T_D$ may include the driving gate 218, the active layer 224a, the ohmic contact layer 224b, the driving source 240, and the driving drain 242. Furthermore, a switching thin film transistor (TFT) $T_S$ may include the switching gate 212, the switching semiconductor layer 222, the switching source 234 and the switching drain 236.

Figure 7E:
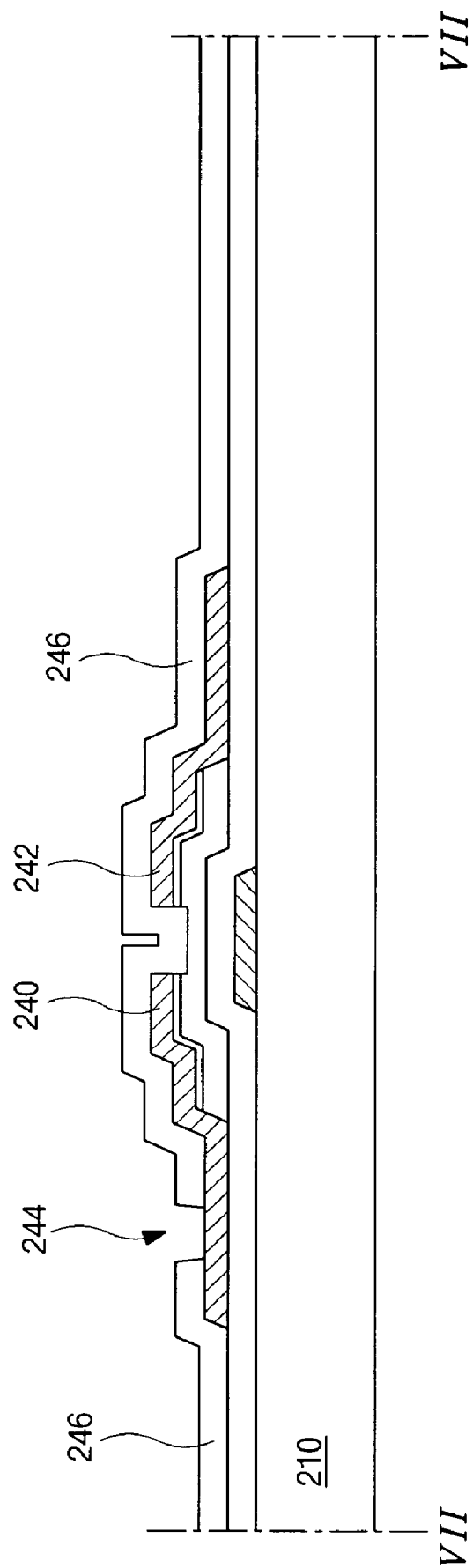

In FIGS. 6E and 7E, after completing the driving TFT $T_D$ and the switching TFT $T_S$, a second insulating layer 246, such as a first passivation layer, may be formed on the first insulating layer 220 to cover the driving TFT $T_D$ and the switching TFT $T_S$. Then, the second insulating layer 246 may be patterned using a mask process, thereby forming a second contact hole 244 that exposes a portion of the driving source 240. The second insulating layer 246 may include an inorganic material, such as silicon nitride ($SiN_X$) or silicon oxide ($SiO_2$).

Figure 7F:
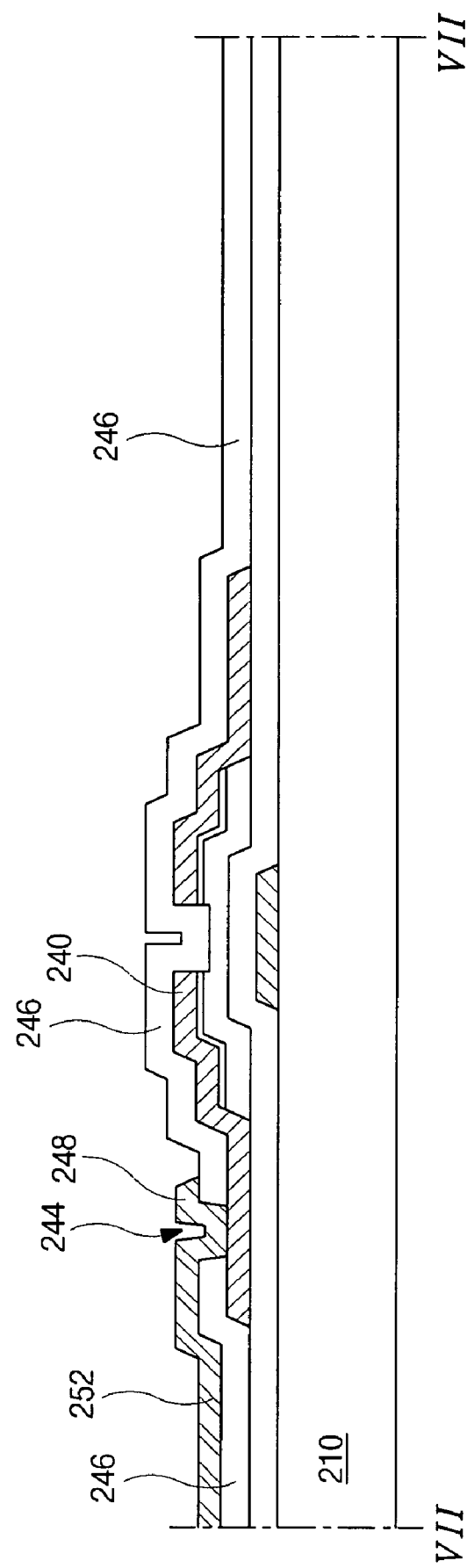

In FIGS. 6F and 7F, a third metal layer may be formed on the second insulating layer 246 after forming the second contact hole 244. Thereafter, the third metal layer may be patterned through a mask process to simultaneously form a power line 252, a power electrode 248, and a second capacitor electrode 250. Accordingly, the power line 252 may perpendicularly cross the gate line 214, and may define a pixel region P along with the gate and date lines 214 and 232. In addition, the power electrode 248 may extend from the power line 252 to overlap the portion of the driving source 240, and may contact the driving source 240 through the second contact hole 244. The second capacitor electrode 250 may extend from the power line 252 to overlap the first capacitor electrode 238, and may constitute a storage capacitor $C_{st}$ along with the first capacitor electrode 238 and the second insulating layer 246.

Figure 7G:
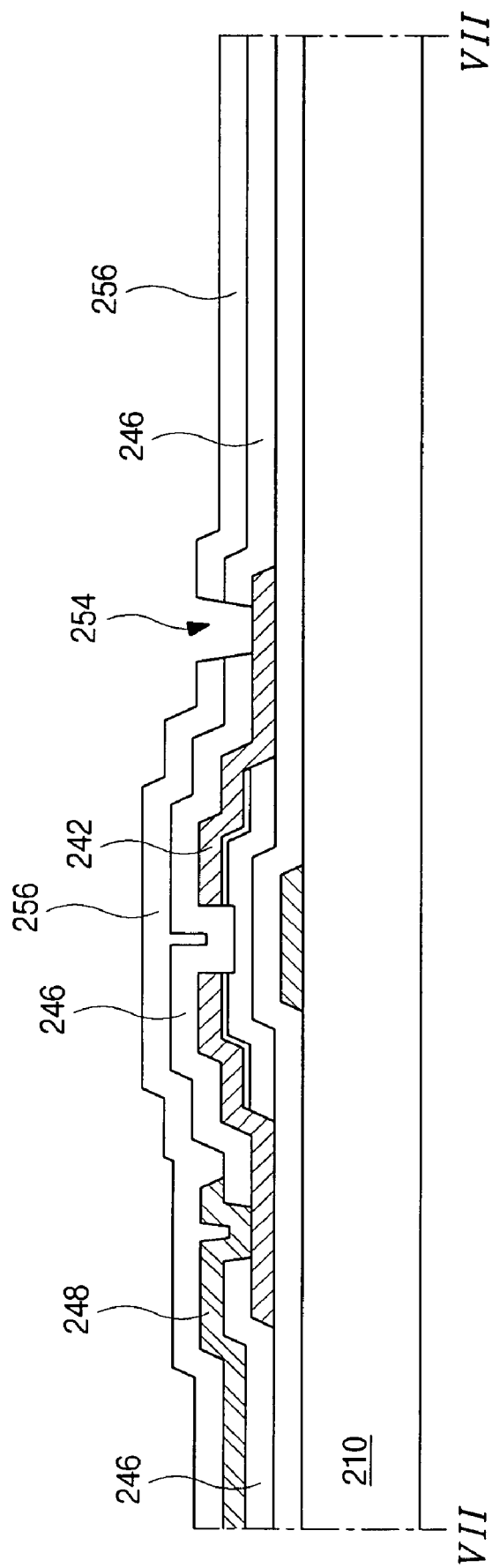

In FIGS. 6G and 7G, a third insulating layer 256, such as a second passivation layer, may be formed on the second insulating layer 246 to cover the power electrode 248, the second capacitor electrode 250, and the power line 252. Then, the first and second passivation layers 246 and 256 may be simultaneously patterned to form a third contact hole 254 that exposes a portion of the driving drain 242, and a fourth contact hole 257 that exposes a portion of the switching drain 236. The fourth contact hole 257 may correspond to a position of the first contact hole 230, and the third insulating layer 256 may include one of an organic insulating material and an inorganic insulating material.

Figure 7H:
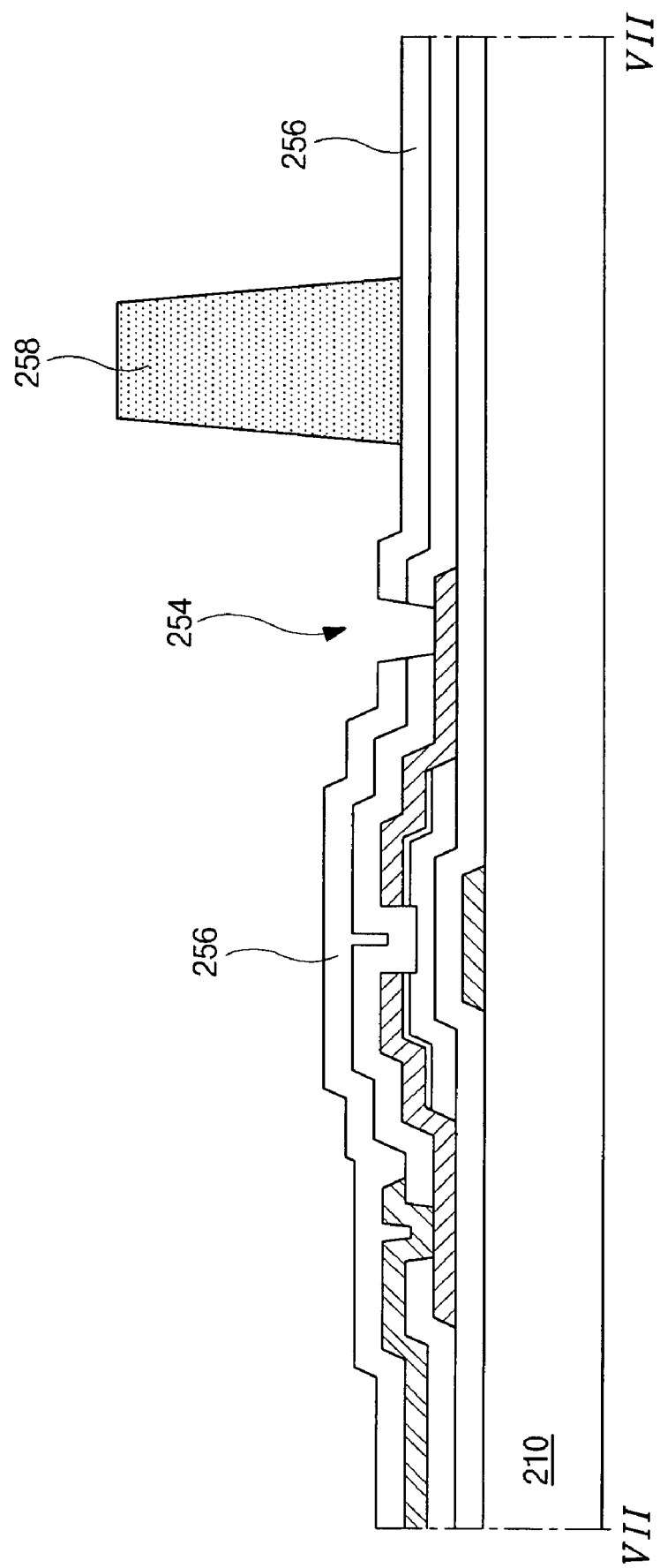

In FIGS. 6H and 7H, a photosensitive organic layer may be formed along an entire surface of the third insulating layer 256, and may be patterned to form a connection pattern 258 within the pixel region P adjacent to the driving TFT $T_D$. The photosensitive organic layer may include an organic material, such as a photo acrylic material. In addition, the connection pattern 258 may have a height greater than the driving TFT $T_D$.

Figure 7I:
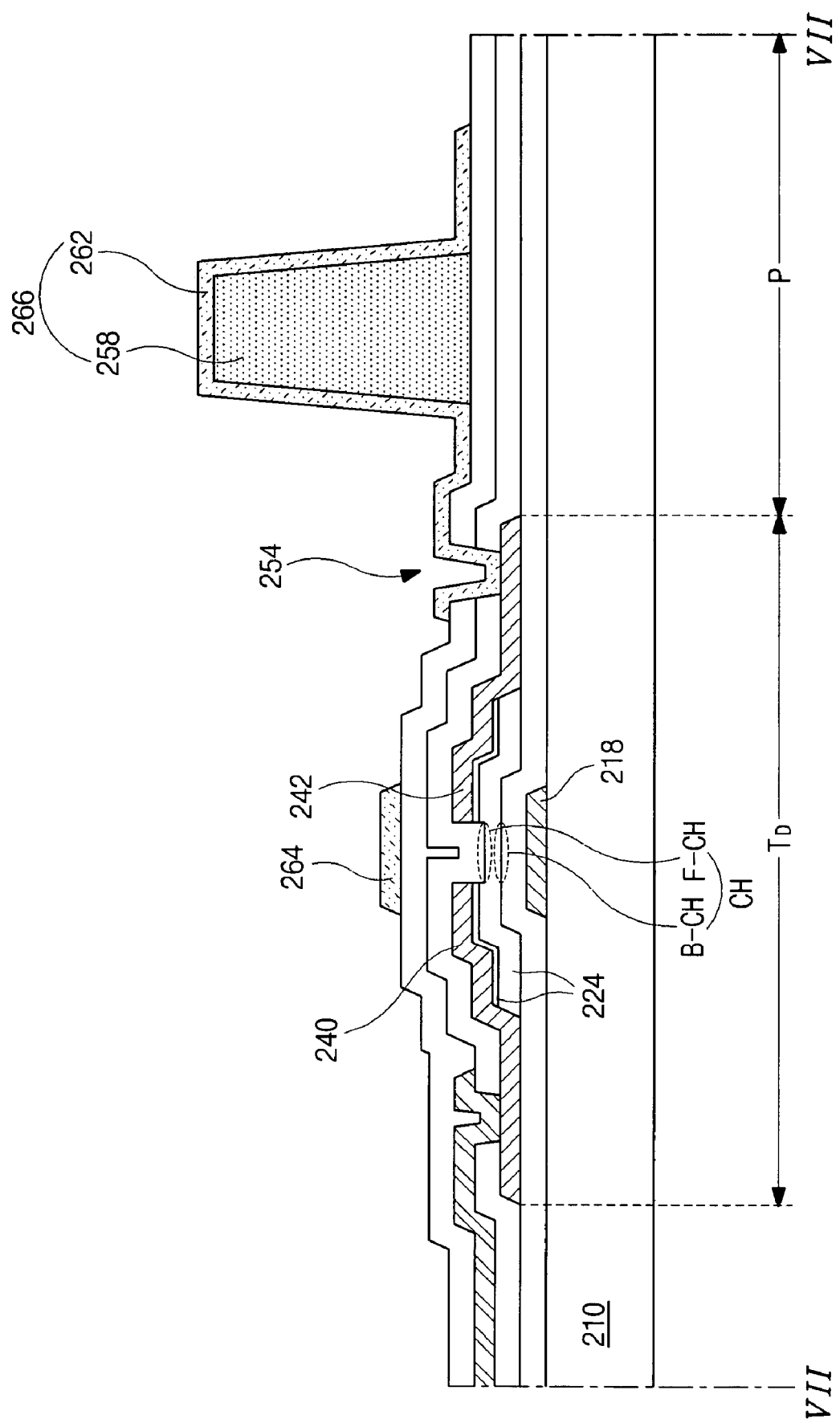

In FIGS. 6I and 7I, a conductive material, such as a metallic material or indium-tin-oxide (ITO), may be formed over the third insulating layer 256 to cover the connection pattern 258. Then, the conductive material may be patterned to simultaneously form a connection electrode layer 262, a second driving gate 264, and a second TFT connector 265. Accordingly, the connection electrode layer 262 may overlap the connection pattern 258, and may contact the driving drain 242 through the third contact hole 254, wherein the connection pattern 258 and the connection electrode layer 262 may constitute an electrical connector 266.

In FIGS. 6I and 7I, the second driving gate 264 may be formed to correspond to a position of the first driving gate 218, and the second TFT connector 265 may also be formed to correspond to a position of the first TFT connector 216. Furthermore, the second driving gate 264 and the second TFT connector 265 may be electrically interconnected to each other similarly to the first driving gate 218 and the first TFT connector 216. The second TFT connector 265 may contact the switching drain 236 through the fourth contact hole 257, whereby the second driving gate 265 may also communicate with the switching TFT $T_S$. Meanwhile, the electrical connector 266 may have a height greater than a total height of the driving TFT $T_D$ and the second driving gate 264.

In FIGS. 6I and 7I, the driving TFT $T_D$ may have two sub-$TFT_S$. For example, a first sub-TFT may include the first driving gate 218 and a second sub-TFT may include the second driving gate 264. Accordingly, the driving semiconductor layer 224 may have two channels CH. For example, a back channel B-CH may be effected by the first driving gate 218, and a front channel F-CH may be effected by the second driving gate 264. Thus, the driving TFT $T_D$ may have improved operating characteristics, such as faster carrier movement.

Figure 8:
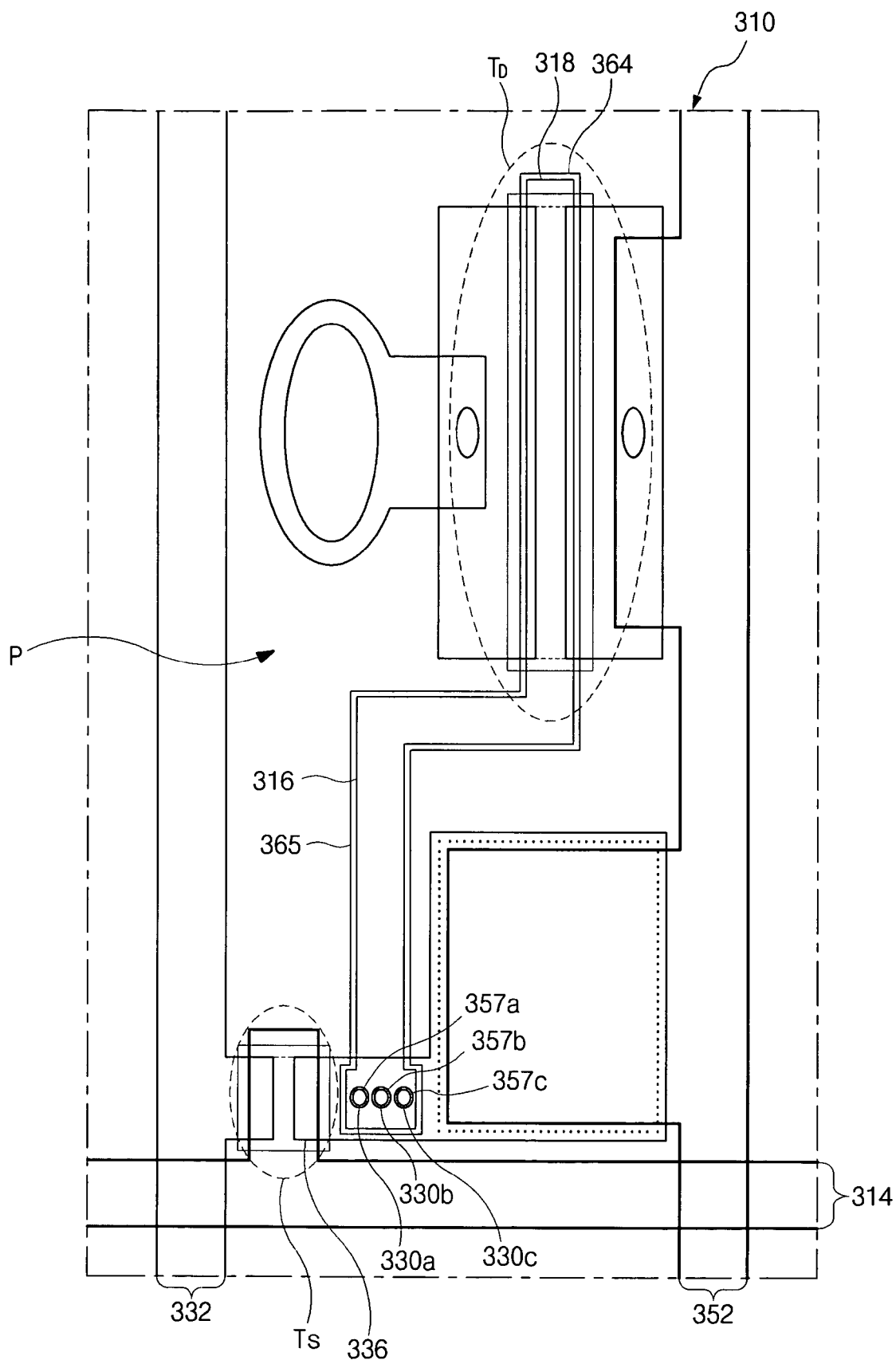
FIG. 8 is a plan view illustrating another exemplary basic pixel structure of the lower panel of FIG. 3 according to the present invention.

FIG. 8 is a plan view illustrating another exemplary basic pixel structure of the lower panel of FIG. 3 according to the present invention. The pixel structure shown in FIG. 8 may be similar to that shown in FIG. 5A, but may have some differences. In FIG. 8, similar to the pixel shown in FIG. 5A, a gate line 314 may be formed on a substrate 310 along a first direction, and a data line 332 and a power line 352 may be formed over the substrate 310 along a second direction substantially perpendicular to the first direction. The data and power lines 232 and 352 may be spaced apart from each other and define the pixel region P by the crossing of the gate line 314. In addition, a switching thin film transistor (TFT) $T_S$ may be disposed adjacent to a crossing of the gate and data lines 314 and 332, and a driving thin film transistor (TFT) $T_D$ may be located within the pixel region P adjacent to the power line 352, and may additionally include first and second driving gates 318 and 364. The switching TFT $T_S$ and the driving TFT $T_D$ may be electrically interconnected to each other through first and second TFT connectors 316 and 365 that may be integrally connected to the first and second driving gates 318 and 364, respectively.

In FIG. 8, the first and second TFT connectors 316 and 365 may contact a switching drain 336 of the switching TFT $T_S$ via plural contact holes 330a, 330b, and 330c and 357a, 357b, and 357c, respectively. Specifically, the first TFT connector 316 may be connected to the switching drain 336 through the first plural contact holes 330a, 330b, and 330c that may be formed in the first insulating layer 220 (in FIG. 5B), and the second TFT connector 365 may be connected to the switching drain 336 through the second plural contact holes 357a, 357b, and 357c that may be formed in the second and third insulating layers 246 and 256 (in FIG. 5B).

The connection through the plural contact holes 330a, 330b, and 330c and 357a, 357b, and 357c may enlarge contact areas between the first TFT connector 316 and the switching drain 336, and between the second TFT connector 365 and the switching drain 336. Accordingly, an increased amount of current may be supplied to the driving TFT $T_D$, thereby improving the operating characteristics of the driving TFT $T_D$. The number of contact holes and the geometrical structure of contact holes may be varied depending on driving TFT's characteristics.

Figure 9A:
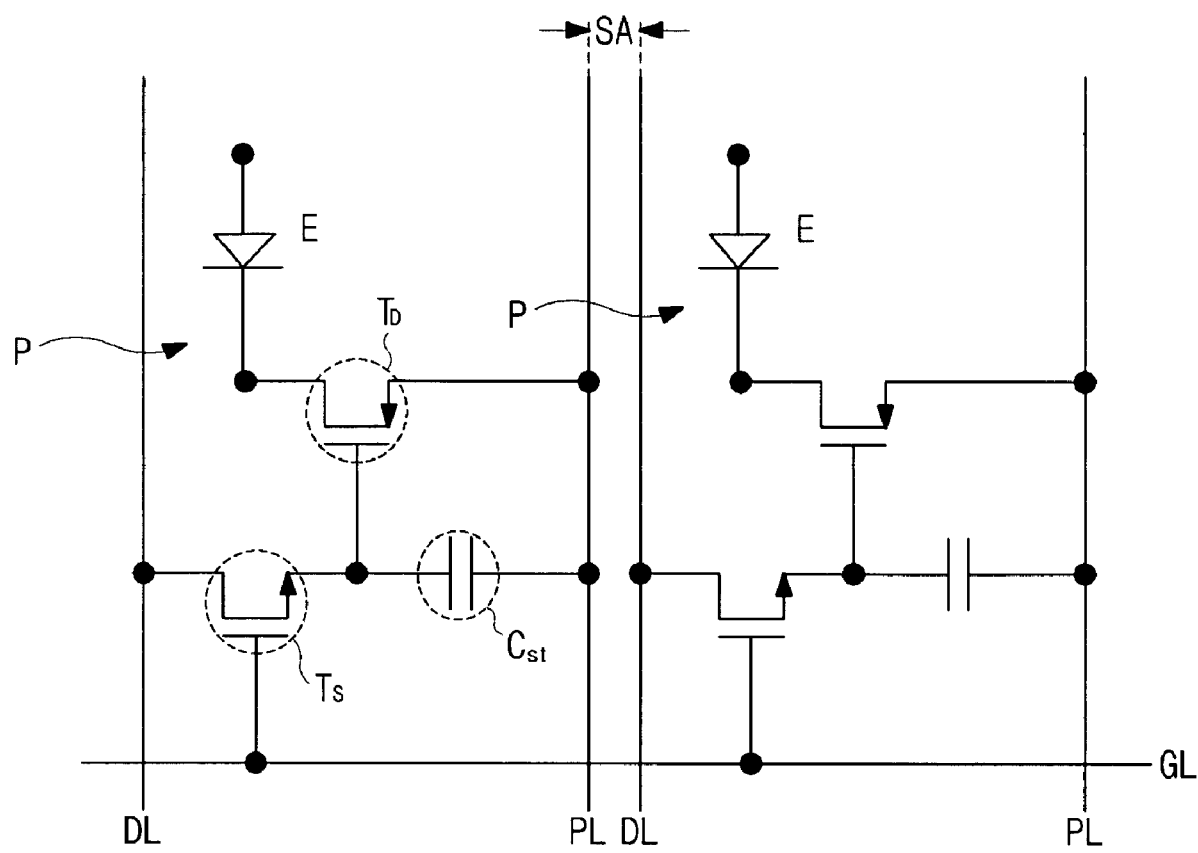
FIG. 9A is an exemplary equivalent circuit diagram of two basic pixels of an OELD device according to the present invention.

FIG. 9A is an exemplary equivalent circuit diagram of two basic pixels of an OELD device according to the present invention. In FIG. 9A, two pixels P may be adjacent to each other, wherein a gate line GL may be disposed along a first direction, and data lines DL and power line PL may be disposed along a second direction perpendicular to the first direction. Each of the pixels P may include a switching thin film transistor (TFT) $T_S$, a driving thin film transistor (TFT) $T_D$, a storage capacitor $C_{st}$, and a light emitting diode (LED) E. Accordingly, a switching gate of the switching TFT $T_S$ may be connected to the gate line GL, a switching source of the switching TFT $T_S$ may be connected to the data line DL, and a switching drain of the switching TFT $T_S$ may be connected to both a driving gate of the driving TFT $T_D$ and a first electrode of the storage capacitor $C_{st}$. In addition, a second electrode of the storage capacitor $C_{st}$ may be connected to the corresponding power line PL, a driving source of the driving TFT $T_D$ may be connected to the corresponding power line PL, and a driving drain of the driving TFT $T_D$ may be connected to a first electrode of the (LED) E.

In FIG. 9, the pixels P may have equivalent arrangements, but may be asymmetrical with respect to the power line PL, wherein each of the pixels P may require one gate line, one data line, and one power line to operate the light LED E. The power line PL of the left pixel may be adjacent to the data line DL of the right pixel, but the power line PL of the left pixel may be spaced apart form the data line DL of the right pixel by a distance SA, which is referred to as a standoff area. However, such standoff areas SA may reduce the pixel size and the TFT's size.

Figure 9B:
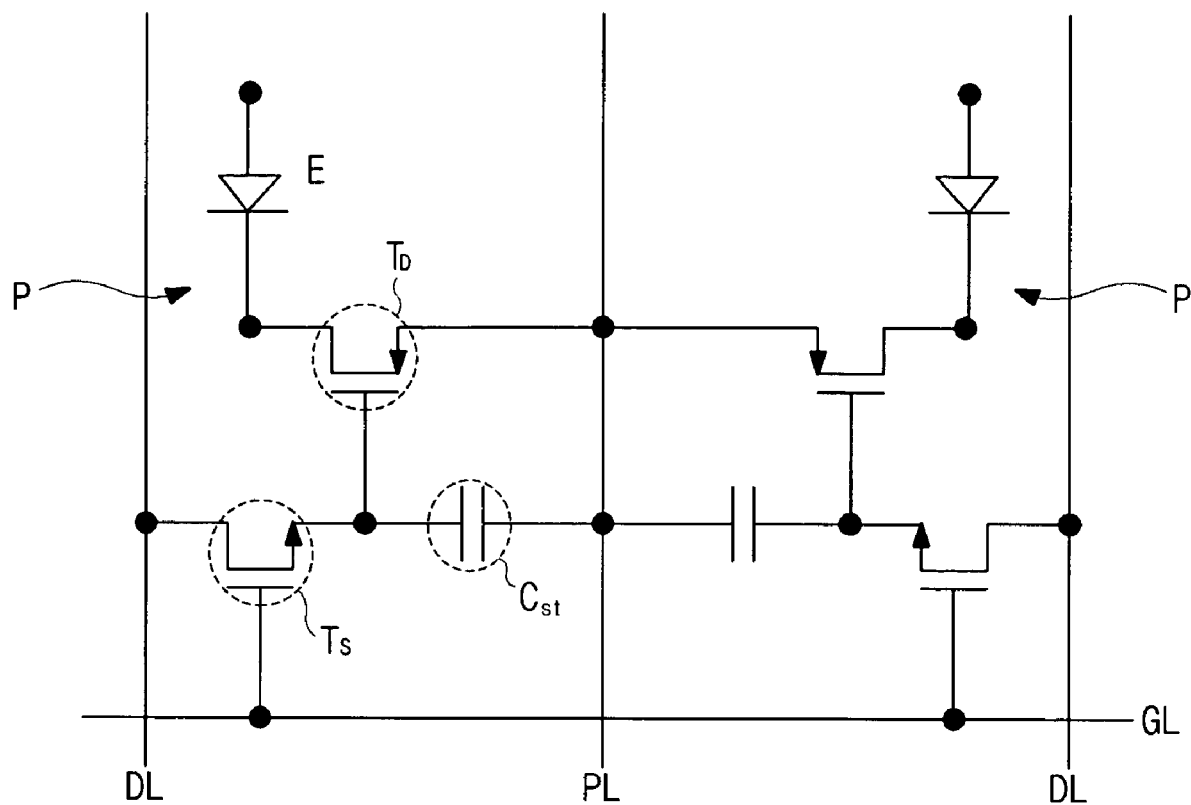
FIG. 9B is another exemplary equivalent circuit diagram of two basic pixels of an OELD device according to the present invention.

FIG. 9B is another exemplary equivalent circuit diagram of two basic pixels of an OELD device according to the present invention. In FIG. 9B, two pixels P are adjacent to each other and have a symmetrical arrangement with respect to the power line LP, unlike those shown in FIG. 9A. In FIG. 9B, a gate line GL may be disposed to extend along a first direction, and data lines DL and power line PL may be disposed to extend along a second direction perpendicular to the first direction. Similar to FIG. 9A, each of the pixels P of FIG. 9B may include a switching thin film transistor (TFT) $T_S$, a driving thin film transistor (TFT) $T_D$, a storage capacitor $C_{st}$, and a light emitting diode (LED) E. However, the second electrodes of the storage capacitors Cst in left and right pixels may be connected to the same power line PL, and additionally the driving sources in left and right pixels may also be connected to the same power line PL. Specifically, the left and right pixels P may share the same power line PL, although they may use different data lines DL. In addition, the left pixel may have the symmetrical arrangement with the right pixel. Accordingly, the standoff area SA of FIG. 9A is not necessary in the pixel arrangement of FIG. 9B, and the pixel size and the TFT's size may be enlarged as much as the standoff area SA.

Figure 10A:
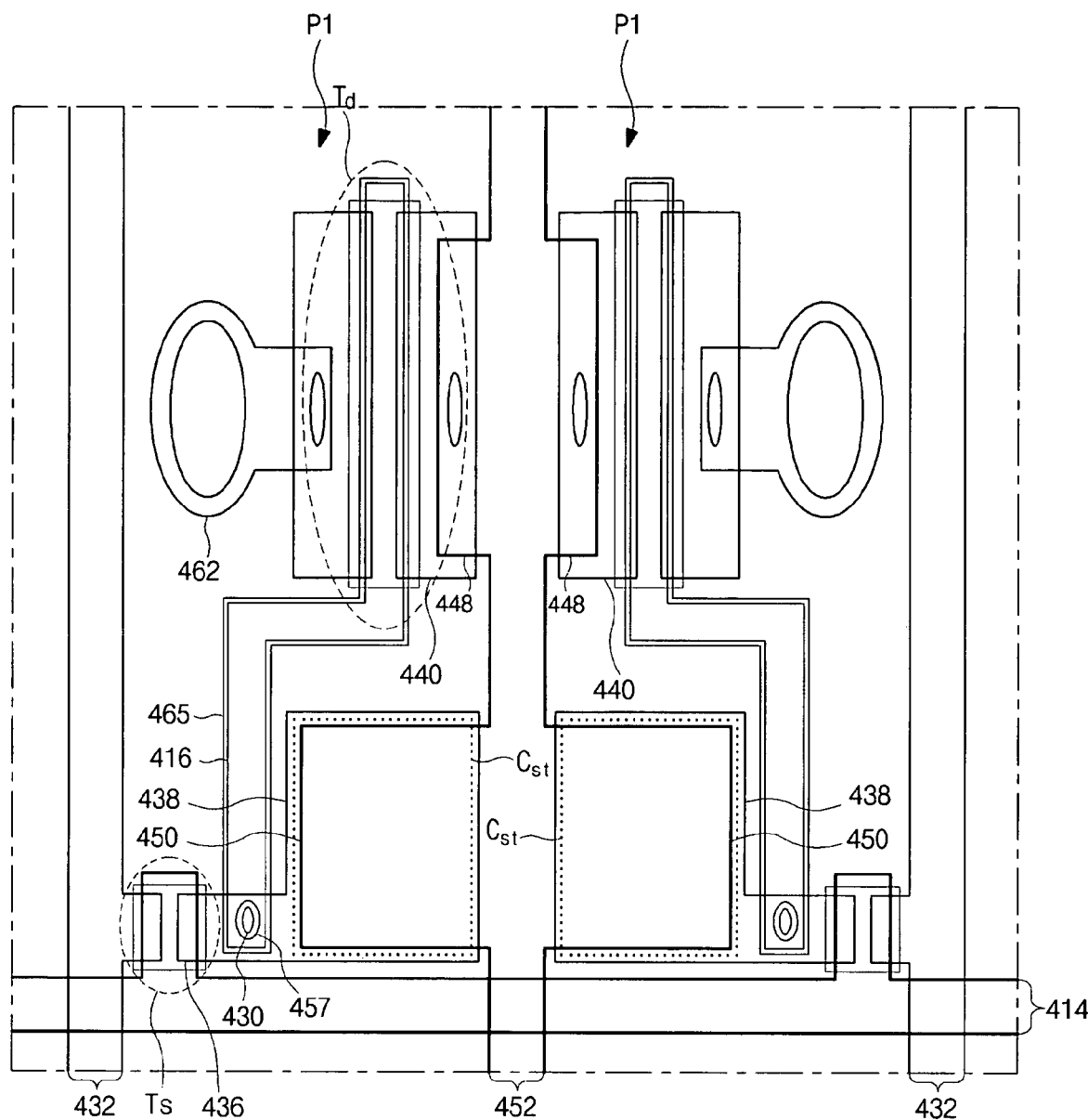
FIGS. 10A and 10B are plane views illustrating an exemplary pixel structure of the adjacent two pixels according to the present invention.
Figure 10B:
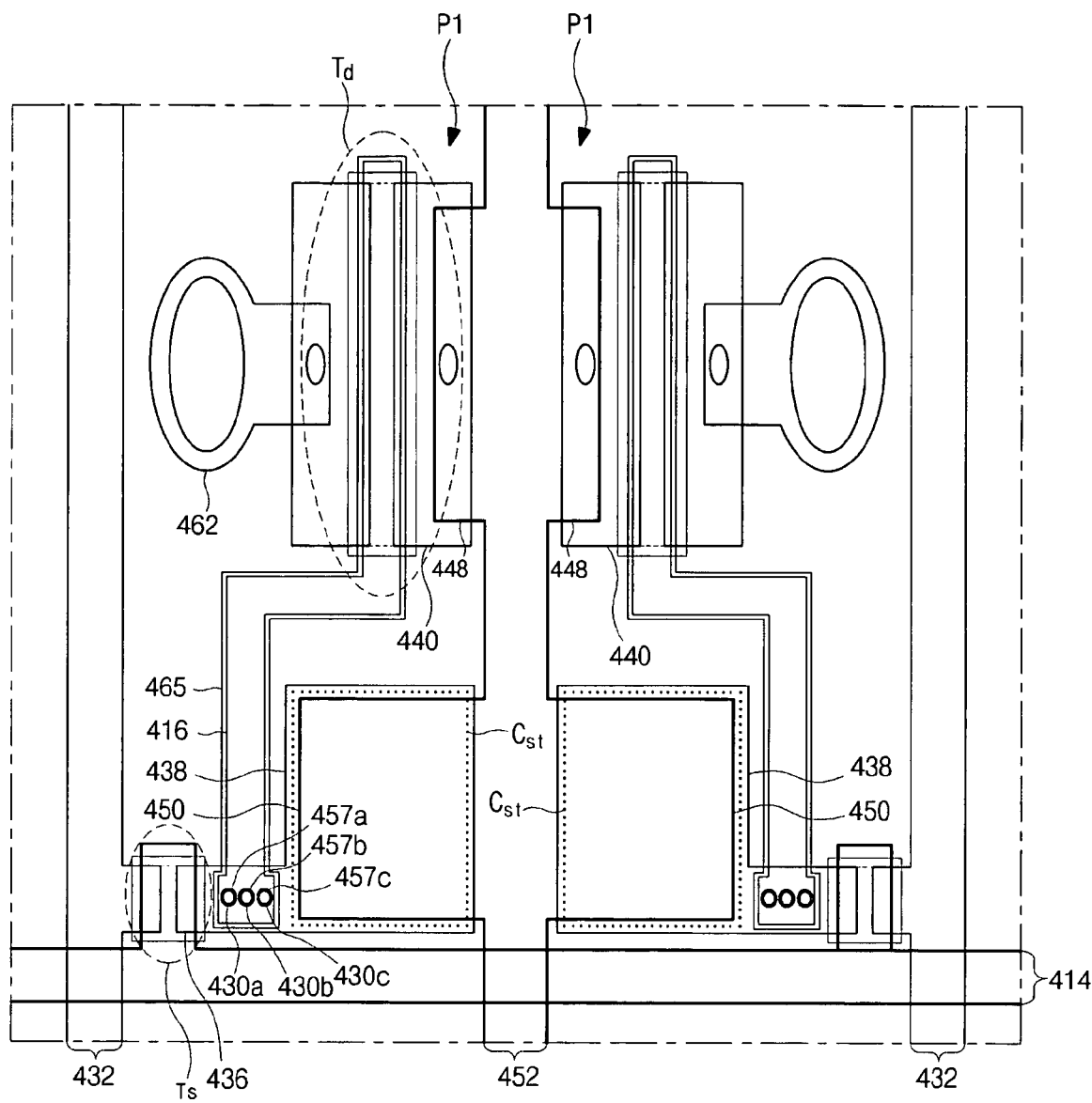

FIGS. 10A and 10B are plane views illustrating an exemplary pixel structure of the adjacent two pixels according to the present invention. In FIGS. 10A and 10B, a gate line 414 may be arranged to extend along a first direction, and data and power lines 432 and 452 may be arranged to extend along a second direction perpendicular to the first direction. For example, two data lines 432 may be on left and right sides, and the power line 452 may be disposed between the two data lines 432, thereby defining first and second pixels P1 and P2 along with the gate line 414. In addition, the first and second pixels P1 and P2 may share the same power line 452.

The switching TFTS $T_S$, the driving TFTS $T_D$, and the storage capacitor $C_{st}$ within the first pixel P1 may be symmetrical with those in the second pixel P2. For example, the switching TFT $T_S$ of the first pixel P1 may be at a left bottom corner, while the switching TFT $T_S$ of the second pixel P2 may be at a right bottom corner. In addition, second storage electrodes 450 may extend form the same power line 452 along both left and right directions and may cover first storage capacitors 438 of the first and second pixels P1 and P2, respectively. Furthermore, power electrodes 448 may extend along both left and right directions from the same power line and may cover driving sources 440 of the first and second pixels P1 and P2, respectively. Accordingly, all elements of the first pixel P1 may have the symmetrical arrangement with those of the second pixel P2 with respect to the power line PL due to the power line PL being jointly owned by the first and second pixels P1 and P2.

In FIG. 10A, first and second TFT connectors 416 and 465 may be connected to a switching drain 436 of the switching TFT $T_S$ through a first contact hole 430 and through a second contact hole 457. However, the first TFT connector 416 of FIG. 10B may be connected to the switching drain 436 through plural first contact holes 430a, 430b, and 430c, and the second TFT connector 465 of FIG. 10B may be connected to the switching drain 436 through plural second contact holes 457a, 457b, and 457c. For example, the pixels of FIG. 10B may have multiple contact holes for the TFT connectors, as compared to those of FIG. 10A.

According to the present invention, since the array layer and the organic EL diode may be formed on different substrates, high production efficiency may be achieved and manufacturing yields may be increased. Second, since the lower panel of the present invention may be utilized for an OELD device, reduction of design limitations of the thin film transistor and a high aperture ratio may be achieved. Third, since the driving TFT has a dual gate structure, the driving TFT may have improved operating characteristics. Furthermore, since the two pixels shares the same power line and have the symmetrical arrangement, the enlarged pixel and TFT may be obtained.

It will be apparent to those skilled in the art that various modifications and variation can be made in the dual panel-type organic electroluminescent device of the present invention without departing from the spirit or scope of the invention. Thus, it is intended that the present invention cover the modifications and variations of this invention provided they come within the scope of the appended claims and their equivalents.

What is claimed is:

1. A dual panel-type organic electroluminescent device, comprising:
    first and second substrates spaced apart from each other;
    a gate line, a data line, and a power line formed over the first substrate;
    a switching thin film transistor connected to the gate and data lines;
    a driving thin film transistor connected to the power line and the switching thin film transistor, the driving thin film transistor including a driving semiconductor layer, a driving source, a driving drain, a first driving gate underneath the driving semiconductor layer, and a second driving gate above the driving semiconductor;
    an electrical connector over the first substrate, the electrical connector including a connection electrode layer connected to the driving thin film transistor;
    first and second thin film transistor connectors connecting the switching thin film transistor to the driving thin film transistor; and
    an organic electroluminescent diode on the second substrate, the organic electroluminescent diode connected to the electrical connector.

2. The device according to claim 1, wherein the driving source is connected to the power line through a first contact hole, and the driving drain is connected to the electrical connector through a second contact hole.

3. The device according to claim 1, wherein the first thin film transistor connector extends from the first driving gate and is connected to the switching thin film transistor through a third contact hole, and the second thin film transistor connector extends from the second driving gate and is connected to the switching thin film transistor through a fourth contact hole.

4. The device according to claim 3, further comprising a storage capacitor including a first capacitor electrode integrally connected to a switching drain of the switching thin film transistor and a second capacitor electrode integrally connected to the power line.

5. The device according to claim 1, further comprising:
a first insulating layer covering the gate line, the first driving gate, and the first thin film transistor connector;
a second insulating layer covering the data line and the driving source and drain; and
a third insulating layer covering the power line,
wherein the second driving gate and the electrical connector are disposed on the third insulating layer.

6. The device according to claim 1, further comprising a power electrode extending from the power line over the driving source.

7. The device according to claim 1, wherein the electrical connector includes a connection pattern underneath the connection electrode layer, and the connection pattern includes a photosensitive organic material.

8. The device according to claim 7, wherein the connection electrode layer completely covers the connection pattern and contacts the driving drain of the driving thin film transistor through a fifth contact hole.

9. The device according to claim 1, wherein the second driving gate, the second thin film transistor connector and the connection electrode layer are simultaneously formed of the same material.

10. The device according to claim 1, wherein the electrical connector has a height greater than a height of the driving thin film transistor.

11. The device according to claim 1, wherein organic electroluminescent diode includes a first electrode, an organic electroluminescent layer, and a second electrode, and the connection electrode layer contacts both the second electrode and the driving drain.

12. The device according to claim 1, further comprising:
an interlayer insulator on the first electrode; and
a partition on the interlayer insulator,
wherein the interlayer insulator corresponds to the gate, data, and power lines, and the partition has tapered sidewalls.

13. The device according to claim 1, wherein the driving thin film transistor includes first and second sub-TFTs each having a back channel effected by the first driving gate and a front channel effected by the second driving gate.

14. A method of fabricating a dual panel-type organic electroluminescent device, comprising:
forming a gate line, a switching gate, a first driving gate, and a first thin film transistor connector on a first substrate;
forming a first insulating layer on the first substrate to cover the gate line, the switching gate, the first driving gate, and the first thin film transistor connector;
forming a switching semiconductor layer corresponding to the switching gate and a driving semiconductor layer corresponding to the first driving gate on the first insulating layer;
forming driving source and drain contacting the driving semiconductor layer, switching source and drain contacting the switching semiconductor layer, and a data line perpendicularly crossing the gate line;
forming a driving channel in the driving semiconductor layer between the driving source and drain, and a switching channel in the switching semiconductor layer between the switching source and drain;
forming a second insulating layer on the first insulating layer to cover the driving source and drain, the driving channel, the switching source and drain, the switching channel, and the data line;
forming a power line and a power electrode on the second insulating layer, the power line spaced apart from the data line and perpendicularly crossing the gate line and the power electrode extending from the power line over the driving source;
forming a third insulating layer on the second insulating layer to cover the power line and the power electrode;
patterning the third and second insulating layers to form a first contact hole exposing a portion of the driving drain and a second contact hole exposing the switching drain;
forming a connection pattern next to the driving drain by exposing and developing a photosensitive organic layer using a mask;
forming a second thin film transistor connector, a second driving gate, and a connection electrode layer on the third insulating layer, the second thin film transistor connector contacts the switching drain through the second contact hole, the second driving gate is integrally connected to the second thin film transistor connector and corresponds to the first driving gate, and the connection electrode layer completely covers the connection pattern and contacts the driving drain through the first contact hole;
forming an organic light emitting diode on a second substrate; and
attaching the second substrate having the organic light emitting diode to the first substrate having the connection electrode layer so as to electrically interconnect the connection electrode layer to the organic light emitting diode.

15. The method according to claim 14, wherein the first insulating layer has a third contact hole exposing a portion of the first thin film transistor connector, and the switching drain contacts the first thin film transistor connector through the third contact hole.

16. The method according to claim 14, wherein forming the switching source and drain includes forming a first capacitor electrode that extends from the switching drain.

17. The method according to claim 14, wherein forming the power line and the power electrode includes a second capacitor electrode extending from the power line over the first capacitor electrode.

18. The method according to claim 14, further comprising a driving thin film transistor including the first and second driving gates, the driving source, the driving drain, and the driving semiconductor layer.

19. The method according to claim 18, wherein the driving thin film transistor includes first and second sub-thin film transistor which having a back channel effected by the first driving gate and a front channel effected by the second driving gate.

20. The method according to claim 19, wherein the connection pattern has a height greater than a height of the driving thin film transistor.

21. The method according to claim 14, further comprising a switching thin film transistor including the switching gate, the switching source, the switching drain, and the switching semiconductor layer.

22. The method according to claim 14, wherein the forming the organic light emitting diode includes:
forming a first electrode on the second substrate;

forming an interlayer insulator on the first electrode in a position corresponding to driving and switching thin film transistors, the power line, and the gate and data lines;

forming a partition on the interlayer insulator, the partition having tapered sidewalls;

forming an organic electroluminescent layer on the first electrode in an area defined by the partition; and forming a second electrode on the organic electroluminescent layer.

23. The method according to claim 14, wherein the patterning the third and second insulating layers includes forming plural second contact holes exposing plural portions of the switching drain.

24. The method according to claim 14, wherein the first insulating layer includes plural third contact holes that expose plural portions of the first thin film transistor connector, and the switching drain contacts a first thin film transistor connector through the plural third contact holes.

25. A dual panel-type organic electroluminescent device, comprising:

first and second substrates spaced apart from each other;

a gate line disposed along a first direction on the first substrate;

a pair of data lines spaced apart from each other and disposed along a second direction over the first substrate;

a power line disposed between the pair of data lines along the second direction over the first substrate and defining a first pixel along with one of the pair of data lines and defining a second pixel with the other one of the pair of data lines;

first and second switching thin film transistors connected to the pair of data lines in the first and second pixels, respectively, the first and second switching thin film transistors are symmetrically disposed with each other with respect to the power line;

first and second driving thin film transistors connected to the power line and the corresponding switching thin film transistors, respectively, the first and second driving thin film transistors are symmetrically disposed with each other with respect to the power line, and each of the first and second driving thin film transistors includes a driving semiconductor layer, a driving source, a driving drain, a first driving gate underneath the driving semiconductor layer, and a second driving gate above the driving semiconductor;

first and second power electrodes oppositely extending from the power line into the first and second pixels, respectively, and overlapping the corresponding driving sources, respectively;

an electrical connector over the first substrate in each of the first and second pixels, the electrical connector including a connection electrode layer connected to the corresponding driving thin film transistor;

first and second thin film transistor connectors in each of the first and second pixels, the first and second thin film transistor connectors connecting the corresponding switching thin film transistor to the corresponding driving thin film transistor; and organic electroluminescent diodes on the second substrate, each of the organic electroluminescent diodes connected to the electrical connector in each of the first and second pixels.

26. The device according to claim 25, wherein the driving source is connected to the power line through a first contact hole, and the driving drain is connected to the electrical connector through a second contact hole.

27. The device according to claim 25, wherein the first thin film transistor connector extends from the first driving gate and is connected to the switching thin film transistor through a third contact hole, and wherein the second thin film transistor connector extends from the second driving gate and is connected to the switching thin film transistors through a fourth contact hole.

28. The device according to claim 25, further comprising first and second storage capacitors disposed in the first and second pixels, respectively, wherein each of the first and second storage capacitors includes a first capacitor electrode integrally connected to a switching drain of the corresponding switching thin film transistor and a second capacitor electrode integrally connected to the power line.

29. The device according to claim 28, wherein the second capacitor electrodes of the first and second storage capacitors oppositely extend from power line into the first and second pixels over the corresponding first capacitor electrode, and the first and second storage capacitors are symmetrical with respect to the power line.

30. The device according to claim 25, further comprising:

a first insulating layer covering the gate line, the first driving gate, and the first thin film transistor connector;

a second insulating layer covering the pair of data lines and the driving source and drain; and a third insulating layer covering the power line and the first and second power electrodes, wherein the second driving gate and the electrical connector are disposed on the third insulating layer.

31. The device according to claim 25, wherein the electrical connector in the first pixel is disposed symmetrically with the electrical connector of the second pixel with respect to the power line, and the electrical connector includes a connection pattern of a photosensitive organic material underneath the connection electrode layer.

32. The device according to claim 25, wherein the connection electrode layer completely covers the connection pattern and contacts the driving drain of each of the driving thin film transistors through a contact hole.

33. The device according to claim 25, wherein the electrical connector has a height greater than a height of the driving thin film transistor.

34. The device according to claim 25, wherein each of organic electroluminescent diodes includes a first electrode, an organic electroluminescent layer, and a second electrode, the first electrode is formed of a transparent conductive material, and the connection electrode layer contacts both the second electrode and the driving drain.

35. The device according to claim 34, further comprising:

an interlayer insulator on the first electrode; and a partition on the interlayer insulator, wherein the interlayer insulator corresponds to the gate line, the pair of data lines, and the power line, and the partition has tapered sidewalls.

36. The device according to claim 25, wherein each driving thin film transistor includes first and second sub-thin film transistors each having a back channel effected by the first driving gate and a front channel effected by the second driving gate.

* * * * *